(12) United States Patent
Shrinivasan et al.

(10) Patent No.: US 6,848,458 B1
(45) Date of Patent: Feb. 1, 2005

(54) APPARATUS AND METHODS FOR PROCESSING SEMICONDUCTOR SUBSTRATES USING SUPERCRITICAL FLUIDS

(75) Inventors: Krishnan Shrinivasan, San Jose, CA (US); Souvik Banerjee, Fremont, CA (US); Francisco Juarez, Fremont, CA (US); Karen A. Reinhardt, San Jose, CA (US); Sanjay Gopinath, Fremont, CA (US)

(73) Assignee: Novellus Systems, Inc., San Jose, CA (US)

( * ) Notice: Subject to any disclaimer, the term of this patent is extended or adjusted under 35 U.S.C. 154(b) by 178 days.

(21) Appl. No.: 10/067,520

(22) Filed: Feb. 5, 2002

(51) Int. Cl.$^7$ ................................................. B08B 3/00
(52) U.S. Cl. ..................... 134/108; 134/103.1; 134/105; 134/107; 134/109; 134/110; 134/184
(58) Field of Search .............................. 134/103.1, 105, 134/107, 108, 109, 110, 184

(56) References Cited

U.S. PATENT DOCUMENTS

| | | | | |
|---|---|---|---|---|
| 3,858,890 A | * | 1/1975 | Wiese | .......................... 277/377 |
| 6,211,422 B1 | * | 4/2001 | DeSimone et al. | ............ 585/16 |
| 2002/0112746 A1 | * | 8/2002 | DeYoung et al. | .............. 134/36 |

FOREIGN PATENT DOCUMENTS

| | | |
|---|---|---|
| WO | WO01/33613 | 5/2001 |
| WO | WO01/33615 | 5/2001 |
| WO | WO01/46999 | 6/2001 |
| WO | WO02/01947 | 1/2002 |

OTHER PUBLICATIONS

Worm et al., "Spray Member and Method for Using the Same," U.S. Publication No. US 2003/0049939, Pub Date: Mar. 13, 2003, 42 Pages.

Costantini et al., "Supercritical Fluid Delivery and Recovery System for Semiconductor Wafer Processing", Pub. No.: US 2001/0050096 A1, Pub. Date: Dec. 13, 2001, Appl. No.: 09/837,507, Filed: Apr. 18, 2001, pp. 1–15.

Chandra et al., "Supercritical Fluid Cleaning Process for Precision Surfaces", Pub. No.: US 2002/0014257 A1, Pub Date: Feb. 7, 2002, Appl. No. 09/861,298, Filed: May 18, 2001, pp. 1–21.

Biberger et al., "High Pressure Processing Chamber for Semiconductor Substrate", Pub. No. US 2002/0046707 A1, Pub. Date: Apr. 25, 2002, Appl. No.: 09/912,844, Filed: Jul. 24, 2001, pp. 1–19.

* cited by examiner

*Primary Examiner*—M. Kornakov
(74) *Attorney, Agent, or Firm*—Beyer, Weaver & Thomas, LLP.

(57) ABSTRACT

The present invention pertains to a system for cleaning wafers that includes specialized pressurization, process vessel, recirculation, chemical addition, depressurization, and recapture-recycle subsystems, as well as methods for implementing wafer cleaning using such a system. A solvent delivery mechanism converts a liquid-state sub-critical solution to a supercritical cleaning solution and introduces it into a process vessel that contains a wafer or wafers. The supercritical cleaning solution is recirculated through the process vessel by a recirculation system. An additive delivery system introduces chemical additives to the supercritical cleaning solution via the solvent delivery mechanism, the process vessel, or the recirculation system. Addition of chemical additives to the sub-critical solution may also be performed. The recirculation system provides efficient mixing of chemical additives, efficient cleaning, and process uniformity. A depressurization system provides dilution and removal of cleaning solutions under supercritical conditions. A recapture-recycle system introduces captured-purified solvents into the solvent delivery mechanism.

59 Claims, 22 Drawing Sheets

SECTION A-A

APPARATUS AND METHODS FOR PROCESSING SEMICONDUCTOR SUBSTRATES USING SUPERCRITICAL FLUIDS

FIELD OF THE INVENTION

This invention relates to methods and apparatus for removing photoresist and post-etch residue from semiconductor wafers using supercritical fluids. Generally, the methods and apparatus disclosed in this invention may also be used for removal of contaminants from semiconductor substrates. More particularly, it relates to a system for cleaning wafers that includes specialized pressurization, process vessels, recirculation, chemical addition, venting, and recycle subsystems, as well as methods for implementing cleaning using such systems.

BACKGROUND OF THE INVENTION

Wafer cleaning in modern VSLI semiconductor processing presents numerous engineering dilemmas. One important issue involves removal of contamination before, during, and after fabrication steps. New processing methods are being developed to work around the deleterious effects (e.g. low-k materials often require less harsh cleaning regimens) of traditional plasma photoresist stripping and cleaning processes. Consequently, non-plasma methods for removing photoresist, residue and contaminants from semiconductor substrates are being developed.

Amongst these new methods, high-pressure processes that employ local densification of a process fluid on the substrate hold promise. Densified fluids are good solvents for contaminants and residues resulting from semiconductor fabrication. Some of these processes, especially those conducted at supercritical pressures, employ additives to increase the solvating power of the process fluid itself. Other additives are used to remove specific contaminants such as polymers, organics, metals, and the like.

Although supercritical fluids are finding acceptance in wafer cleaning regimens, they present many engineering challenges. Most existing apparatus and methods lack flexibility and practicality. Conventional methods and apparatus that employ supercritical fluids for cleaning wafers involve batch type processing. Typically a wafer and one or more cleaning agents are placed in a process vessel. The vessel is sealed. The vessel is then charged with a solvent, and the contents of the process vessel are brought to supercritical conditions. Hence, both cleaning agent dissolution and supercritical solution generation are performed in the presence of the wafer. Once the cleaning process is complete, the process vessel is vented and the substrate is removed. Commonly, opening and closing such vessels is labor intensive. For example, many bolts and components must be secured and removed with each process run. Another disadvantage of traditional vessels is that opening and closing for wafer exchange involves moving heavy components. Overcoming these high inertial loads makes wafer exchange in such systems inefficient.

Another problem with conventional batch type cleaning processes is that they do not allow for easy adjustment in certain process conditions during the course of cleaning. For example, a particular cleaning regimen may call for sequential exposure of a wafer to multiple cleaning agents. This is often necessary when the cleaning agents are hard to dissolve or to keep in solution. In other cases, mixtures of chemical additives for removal of specific contaminants may be used in sequence to perform a cleaning process without removing the substrate from the vessel. In these cases, batch systems are inappropriate because they do not allow easy replacement of one cleaning solution with another in the process vessel, while maintaining supercritical conditions.

Supercritical fluid processes typically require a large volume of supercritical fluid. After processing, oftentimes the processing fluid is vented to a non-recoverable waste stream. This ultimately is bad for the environment and costly. A system that minimizes the amount of supercritical solvents used as well as recycles at least a portion of the solvents is desirable.

What is therefore needed are improved apparatus and methods for cleaning wafers with supercritical fluids. Preferably the apparatus and methods provide flexibility in supercritical fluid cleaning regimens.

SUMMARY OF THE INVENTION

The present invention pertains to apparatus and methods for supercritical fluid cleaning of semiconductor wafers. More particularly, it relates to a system for cleaning wafers that includes one or more of specialized pressurization, process vessel, recirculation, chemical addition, depressurization, and recapture-recycle subsystems, as well as methods for implementing wafer cleaning using such systems. A solvent delivery mechanism converts a liquid-state sub-critical solution to a supercritical cleaning solution and introduces it into a process vessel that contains a wafer or wafers. In one embodiment, the process vessel has a door mechanism for ease in wafer introduction and removal. The supercritical cleaning solution can be recirculated through the process vessel by a recirculation system. An additive delivery system introduces chemical additives to the supercritical cleaning solution via the solvent delivery mechanism, the process vessel, or the recirculation system. Addition of chemical additives to the sub-critical solution may also be performed. The recirculation system provides efficient mixing of chemical additives, efficient cleaning, and process uniformity. A depressurization system provides dilution and removal of cleaning solutions under supercritical conditions. A recapture-recycle system introduces captured-purified solvents into the solvent delivery mechanism.

One aspect of the invention is a system for cleaning semiconductor wafers. Such a system may be characterized by the following features: a solvent delivery mechanism configured to provide a supercritical cleaning solution; a process vessel in downstream fluid communication with the solvent delivery mechanism, said process vessel having a wafer support; and a recirculation system in fluid communication with the process vessel, said recirculation system configured to allow the supercritical cleaning solution to recirculate through the process vessel such that a flow field is established over at least one surface of a wafer or a plurality of wafers in the wafer support to thereby clean the surface or surfaces that contact the flow field.

The solvent delivery mechanism may be characterized by the following features: a source of a sub-critical solvent or a sub-critical cleaning solution; an inlet configured to receive the sub-critical solvent or cleaning solution and deliver it to; a supercritical solution generator configured to convert the sub-critical cleaning solvent or solution into the supercritical cleaning solution; and an outlet configured to deliver the supercritical cleaning solution from the supercritical solution generator to the process vessel. The supercritical solution generator may be characterized by the following features: a pump configured to pressurize the sub-critical cleaning solvent or solution to at least its critical point; and a heat exchanger in fluid communication with the pump, said heat exchanger configured to heat the sub-critical cleaning solvent or solution to at least its critical temperature.

In preferred embodiments, the solvent delivery mechanism includes a buffer vessel in downstream fluid communication with the heat exchanger, said buffer vessel configured to store between about 5 and 25 times the volume of the supercritical cleaning solution than the combined volume of the process vessel and the recirculation system. Also preferably, pressure sensors are used to provide feedback control to components (for example heaters, pumps, and valves) of the system in order to regulate pressure in the buffer vessel, process vessel, and the like.

The pressure vessel may include a first and a second plate, when mated, the plates create a process cavity that holds a wafer support. Preferably the process vessel is made of a corrosion resistant material including at least one of stainless steel, aluminum, titanium, hastelloy, and nickel-iron alloys. When mated, the first and second plates' mating surfaces form a fluid-tight seal. This seal is achieved by a series of seals which includes a primary seal, a secondary seal, and back-up seals. Also preferably, the process vessel includes a slot configured to allow insertion of the wafer or the plurality of wafers into the process vessel; and a door mechanism configured to seal the slot while the process vessel is charged with the supercritical solution. The process vessel may include a heater for heating at least one surface of the process cavity (for example one of the plates is heated).

Preferably the process cavity has a plurality of plenums configured to receive the supercritical cleaning solution from a process vessel inlet. The process cavity also contains a plurality of flow distribution manifolds each dimensioned to mate with one of the plurality of plenums, when mated, said plurality of plenums and flow distribution manifolds are configured to create the flow field that contacts the wafer surface or surfaces during cleaning. Each of the plurality of flow distribution manifolds includes a plurality of grooves or holes configured to direct the flow of the supercritical cleaning solution from its corresponding plenum and onto an interior surface of the process cavity before flowing onto a surface of the wafer. The flow distribution manifolds may also have exterior contouring, shaped to mediate the flow field on the wafer surface or surfaces.

Preferably the recirculation system includes a pump configured to move the supercritical cleaning solution through the recirculation system, and an inline static mixer configured to provide a circuitous path to the supercritical cleaning solution. The recirculation system may also include a first particulate filter in upstream fluid communication with the pump, said first particulate filter configured to remove particulates from the supercritical cleaning solution before said supercritical cleaning solution enters the pump, and a second particulate filter in upstream fluid communication with the process vessel, said filter configured to remove particulates from the supercritical cleaning solution before said supercritical cleaning solution enters the process vessel. Also preferably, the recirculation system includes isolation valves for stopping fluid communication of the recirculation system with the processing vessel.

The cleaning system of the invention may further include a depressurization system configured to vent the supercritical cleaning solution from the system. Preferably the depressurization system is configured to vent the supercritical cleaning solution from the process vessel. The depressurization system includes plurality of control valves in parallel fluid communication. The control valves include: a first exhaust flow control valve configured to meter the release of the supercritical cleaning solution no faster than the supercritical cleaning solution can be introduced into the process vessel by the solvent delivery mechanism, a second exhaust control valve having a higher flow coefficient than the first exhaust control valve; and a dump valve having a higher flow coefficient than the second exhaust control valve.

The cleaning system of the invention may further include a solvent recycle system in downstream fluid communication with the depressurization system. Preferably the solvent recycle system is configured to capture sub-critical media from vapor resulting from release of the supercritical cleaning solution by the depressurization system. Also preferably, the sub-critical media is purified after capture to produce a recycled solvent. The recycled solvent may be delivered to the solvent delivery mechanism for use in production of the supercritical cleaning solution.

The cleaning system of the invention also includes a pulsing mechanism coupled to the recirculation system or the process vessel. Preferably the pulsing mechanism is configured to control the pressure of the supercritical cleaning solution to which the wafer or plurality of wafers are exposed in manner that provides a pulsed pressure distribution.

Other apparatus of the invention may have more or less than the above-stated components or features. Preferred embodiments of the invention are discussed in relation to exemplary apparatus of the invention in the detailed description portion following the summary.

Another aspect of the invention is a method of cleaning a semiconductor wafer. Such methods may be characterized by the following sequence: providing the wafer to a process vessel, preparing a supercritical cleaning solution, providing the supercritical cleaning solution to the process vessel, and recirculating the supercritical cleaning solution through the process vessel in a manner causing a flow field to be established over at least one surface of the wafer, to thereby clean the wafer. Preferably the flow field is established over the front side and back side surfaces of the wafer to clean both the front side and back side surfaces. Also preferably the wafer includes one or more of the following materials to be removed: photoresist, post-etch residue, organic contaminants, metallic contaminants, inorganic contaminants, particles, and the like. Preferably providing the wafer to the process vessel includes positioning the wafer on a support in the process vessel in a manner that presents open access to both the front side and back side surfaces of the wafer.

Preparing the supercritical cleaning solution preferably includes the following sequence: (i) providing a sub-critical cleaning solvent or solution, (ii) raising the pressure of the sub-critical cleaning solvent or solution to at least its critical pressure, and (iii) raising the temperature of the sub-critical cleaning solvent or solution to at least its critical temperature. In a preferred embodiment, (ii) is performed before (iii). Preferably the sub-critical cleaning solvent or solution includes carbon dioxide.

Also preferably, preparing the supercritical cleaning solution includes converting the sub-critical solvent into a supercritical solvent; and introducing one or more additives into the supercritical solvent. Preferably the one or more additives are selected from the group consisting of reagents that chemically or physically react with a material to be cleaned from the wafer, a chelating agent that chelates one or more metal ions in the material to be cleaned from the wafer, a surfactant that assists in cleaning the material from the wafer, an anti-corrosion agent that protects a material on the surface of the wafer, a co-solvent that increases the solubility of any one or more of the foregoing in the supercritical solvent, and combinations thereof. Preferably the surfactant assists in the formation of stable emulsions of contaminates not normally soluble in the solvent thus enabling them to clean them from the wafer. Preferably the additives are added to the supercritical solvent via the process vessel, a recirculation loop (for circulating the supercritical solution as described above), or a solvent delivery system. Preferably mixing the one or more additives with the supercritical solvent is performed by passing the supercritical solvent and the one or more additives through a flow element that produces turbulent flow. Providing the supercritical cleaning solution to the process vessel may also include generating the supercritical cleaning solution, and storing the supercritical cleaning solution in a buffer vessel before providing the supercritical cleaning solution to the process vessel. Such a buffer vessel is preferably configured to store between about 5 and 25 times the volume of the supercritical cleaning solution than the volume of the process vessel.

Preferably, supercritical cleaning solutions are removed from the process vessel (and other cleaning system components that are in fluid communication with the process vessel) by introducing a supercritical solvent to the process vessel after the wafer has been cleaned. In a preferred method, introducing a supercritical solvent to the process vessel to remove the supercritical cleaning solution after the wafer has been cleaned includes opening an inlet valve to allow introduction of the supercritical solvent into the process vessel, and opening a first outlet valve to vent the supercritical cleaning solution from the process vessel and simultaneously introduce the supercritical solvent into the process vessel. Preferably the rate of introduction of the supercritical solvent and the rate of venting of the supercritical cleaning solution are adjusted so that supercritical conditions are maintained in the process vessel.

Once the supercritical cleaning solution is removed from the system, a depressurization method of the invention is performed. Preferably this includes opening a second outlet valve to at least partially depressurize the process vessel and render the supercritical solvent sub-critical. Such methods may further include opening a third outlet valve was opened, to complete depressurizing the process vessel, and removing the wafer from the process vessel.

Methods of the invention also include: sensing a pressure differential between inlet and outlet lines of a recirculation loop to determine whether the supercritical cleaning solution is flowing properly, pulsing the pressure of the supercritical cleaning solution recirculating through the process vessel while cleaning the wafer, capturing the effluent from venting the supercritical cleaning solution with a recapture-recycle system, and purifying any solvents that the effluent contains with the recapture-recycle system.

These and other features and advantages of the present invention will be described in more detail below with reference to the associated drawings.

DETAILED DESCRIPTION OF PREFERRED EMBODIMENTS

Figure 1:
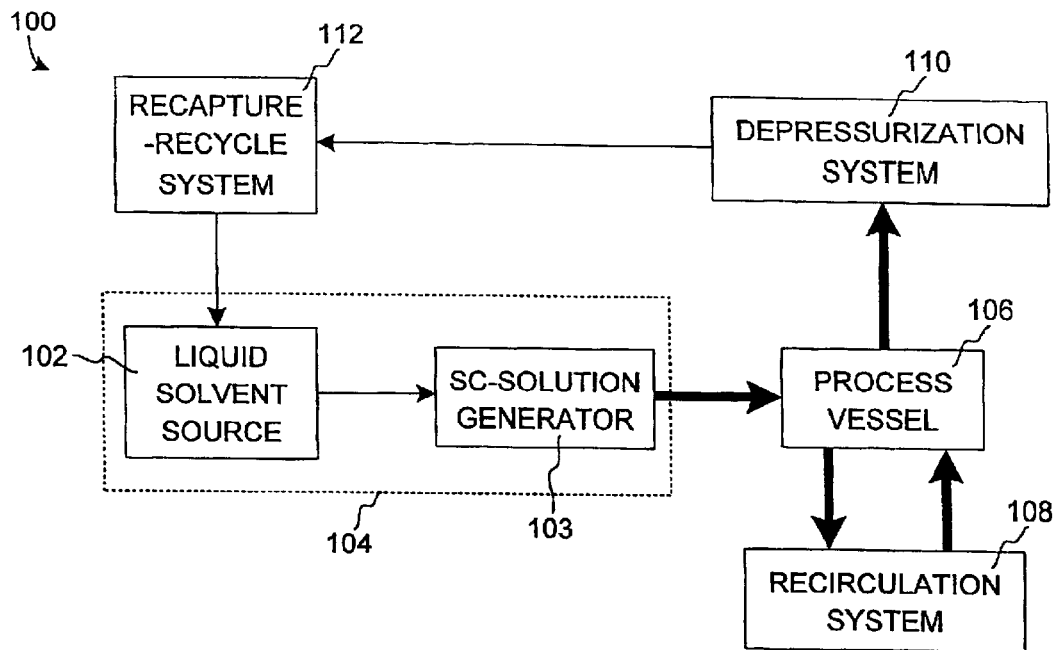
FIG. 1 is a simplified block diagram of a wafer cleaning system in accordance with the invention.

In the following detailed description of the present invention, numerous specific embodiments are set forth in order to provide a thorough understanding of the invention. However, as will be apparent to those skilled in the art, the present invention may be practiced without these specific details or by using alternate elements or processes. For example, the invention is described generally in terms of cleaning contaminates from a wafer, the invention can also be used for depositing films or otherwise treating wafers with supercritical solvent media. In some descriptions herein, well-known processes, procedures, and components have not been described in detail so as not to unnecessarily obscure aspects of the present invention.

In this application, the term "wafer" is used extensively. The term "wafer" generally refers to a semiconductor wafer as such wafer exists during any of many stages of integrated circuit fabrication thereon. Preferably the invention is used to clean wafers. While the discussion herein focuses on wafer cleaning operations, the invention applies equally to various other integrated circuit fabrication operations that can be performed with supercritical media. In some embodiments, the invention is used as part of a Damascene process for creating copper lines on wafers. In a specific example, the invention can be used to deposit copper or dielectric materials under supercritical conditions. However as mentioned, the invention is not limited to such processing.

The term "wafer support" is meant to describe a support for a wafer or wafers during contact with a supercritical fluid for cleaning, deposition, or other processing. Generally, a wafer support has an orientation such that a wafer backside rests on the wafer support surface and the wafer front side faces up. The invention is not limited in this way, however. One skilled in the art would recognize that other wafer orientations are possible for processing with fluids, that is, the wafer may be tilted at any angle from horizontal, including "flipped" from the above described orientation (i.e. where the back side faces up).

Supercritical fluids or solutions exist when the temperature and pressure of a solution are above its critical temperature and pressure. In this state, there is no differentiation between the liquid and gas phases and the fluid is referred to as a dense gas in which the saturated vapor and saturated liquid states are identical. Near supercritical fluids or solutions exist when the temperature and pressure of a solution are both greater than 80% of their critical point, but the solution is not yet in the supercritical phase. Due to their high density, supercritical and near supercritical fluids possess superior solvating properties. In this application, when a fluid, solvent, or other solution is referred to as "supercritical" it is understood to describe both supercritical and near supercritical conditions. In this application, the term "supercritical solution" refers to the supercritical form of a solvent and one or more solutes. Note that a supercritical solution may include mixtures of solvents. The solute may be a reagent, a reactant, a chelating agent, another solvent, or other material.

FIG. 1 shows a wafer cleaning system, 100, of the invention. Included in wafer cleaning system 100 are a solvent delivery mechanism 104 (within dotted line), a process vessel 106, a recirculation system 108, a depressurization system 110, and a recapture-recycle system 112. Solvent delivery mechanism 104 includes a liquid solvent source 102 and supercritical solution generator 103.

In a preferred embodiment, solvent delivery mechanism 104 receives a sub-critical liquid solvent (for example liquid carbon dioxide) and converts it to a supercritical solution. The resulting solution is delivered to process vessel 106 (the heavy arrows in FIG. 1 depict supercritical fluid communication between solvent delivery mechanism 104, process vessel 106, recirculation system 108, and depressurization system 110; the fine arrows depict sub-critical fluid communication within apparatus 100). The supercritical solution contacts a wafer or wafers held within process vessel 106. The supercritical solution is recirculated through process vessel 106 (and over the wafer or wafers) via recirculation system 108. After processing the wafers, the supercritical solution is vented via depressurization system 110. Sub-critical solvent exits system 110 and is recaptured and processed (preferably recycled) in recapture-recycle system 112. Purified solvents from system 112 are reintroduced into solvent delivery mechanism 104 in a sub-critical state. A number of the sub-systems outlined above in relation to FIG. 1 are described in more detail below in association with subsequent figures.

Figure 2:
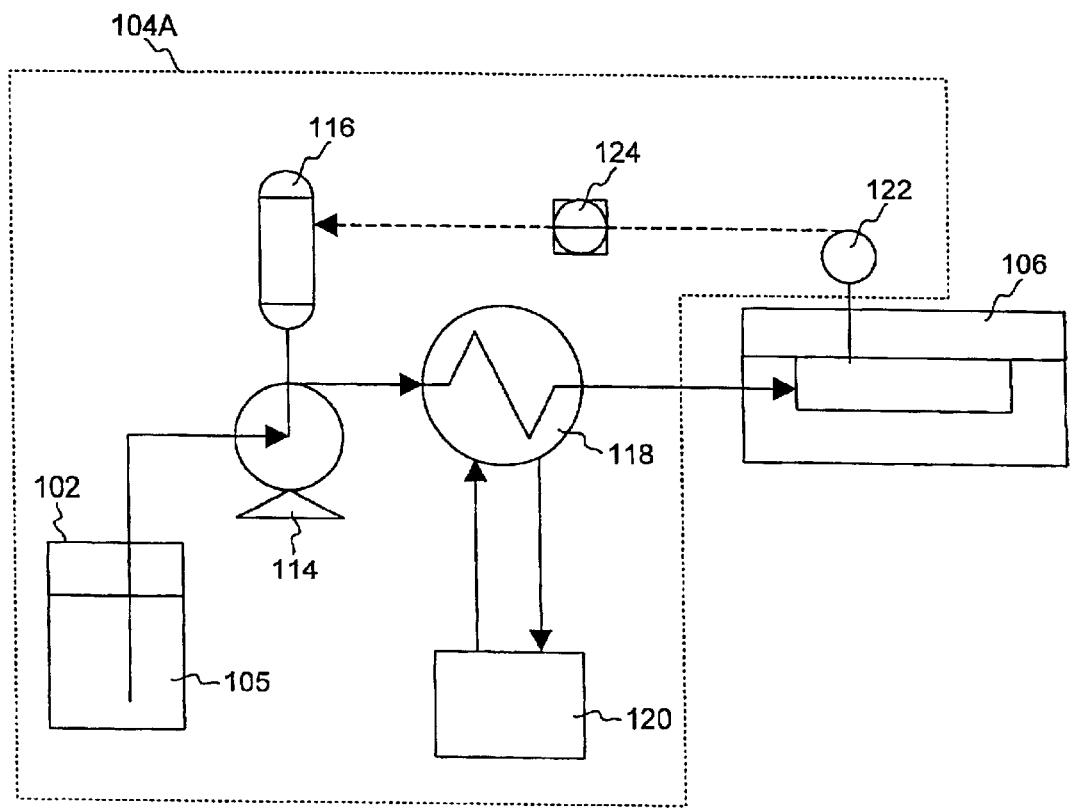
FIGS. 2-3 are simplified block diagrams of solvent delivery mechanisms in accordance with the invention.

FIG. 2 shows one embodiment of solvent delivery mechanism 104. In this case, a solvent delivery mechanism, 104A, is depicted (within dotted line area). Solvent delivery mechanism 104A includes a solvent source 102. Solvent source 102 in many cases is a dewar. Dewar 102 contains a sub-critical liquid solvent 105. Solvent 105 is delivered to a pump 114 (via an eductor tube or by otherwise tapping into the sub-critical solvent liquid at the bottom of the dewar). Pump 114 pressurizes solvent 105 and delivers it to a heat exchanger 118. Heat exchanger 118 receives heat from a heater 120. In this example, heater 120 provides heat to heat exchanger 118 via circulation of a heated fluid through the heat exchanger. Such heat exchangers for this purpose include various forms such as parallel plate, shell and tube, coaxial coil, and the like. Alternatively, electrical resistance heaters can be imbedded directly in heat exchanger 118.

Pump 114 pressurizes sub-critical solvent 105, and the pressurized fluid is then heated by heat exchanger 118. The combination of pressurization by pump 114 and heating by heat exchanger 118 creates a supercritical solution. Solvent 105 is maintained at a temperature well below its critical temperature. Pump 114 pressurizes solvent 105 to at least its critical pressure, thus creating a pressurized fluid. In this application, critical pressure is meant to mean the pressure at which the solvent would turn supercritical if it were at its critical temperature. In this case, since sub-critical solvent 105 is well below its critical temperature when it reaches pump 114, it does not reach a supercritical state within pump 114. The pressurized fluid is then delivered to heat exchanger 118, where it is heated to its at least its critical temperature. This converts the pressurized fluid to a supercritical solution for delivery to process vessel 106.

An advantage of solvent delivery mechanism 104A is that a liquid solvent is first pressurized and then heated to form a supercritical phase. This differs from conventional systems, wherein the sub-critical liquid solvent is converted into a gas, which is then compressed (via a gas compressor) in order to create a supercritical phase, a much more energy intensive process.

Solvent delivery mechanism 104A delivers supercritical cleaning solution directly into process vessel 106. In this example, a pressure sensor 122 measures process vessel pressure. It provides this information to a pressure controller 124. Pressure controller 124 can be programmed to ramp pressure at a given rate. Once the desired process vessel pressure is achieved, pressure controller 124 controls the pressure of the system by use of a closed-loop algorithm such as a proportional integral derivative or PID. Such control is achieved by controlling the pumping rate of pump 114 via motor 116 to reach the target pressure. The invention is not limited to this feed back control mechanism, other control mechanisms may be employed.

Figure 3:
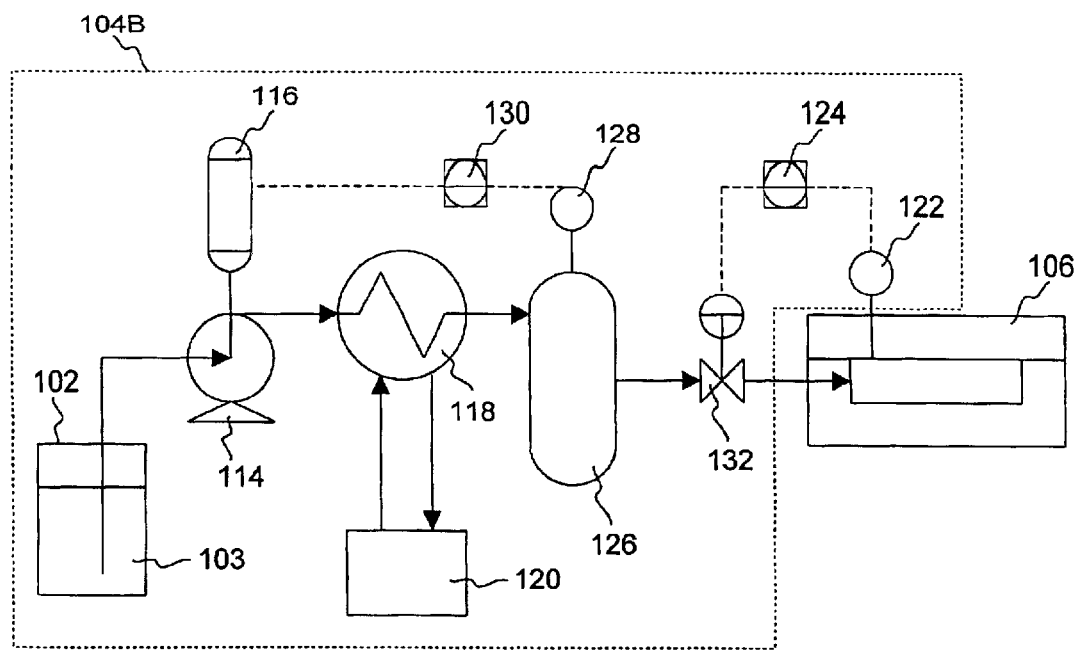

In an alternative embodiment, an intermediate buffer vessel is used to store the supercritical cleaning solution before delivery to the process vessel. FIG. 3 shows a solvent delivery mechanism, 104B (within dotted line area), which uses such a buffer vessel. Solvent delivery mechanism 104B includes many of the components that were described for solvent delivery mechanism 104A in FIG. 2. In this case, supercritical cleaning solution leaving heat exchanger 118 enters a buffer vessel 126. Buffer vessel 126 has a volume to hold sufficient supercritical cleaning solution to rapidly fill process vessel 106 for processing. In a preferred embodiment, buffer vessel 126 holds a volume of supercritical solution to equal between about 5 and 25 times the volume of the process cavity (which holds the wafer or wafers) in process vessel 106. If a recirculation system is included with the wafer clean system, then buffer vessel 126 holds a volume of supercritical solution equal to between about 5 and 25 times the combined volume of the process cavity and the volume of the recirculation system. In this way, processing is expedited because the system can be charged with supercritical solution much faster.

Buffer vessel 126 is maintained at a constant pressure sufficiently in excess of a desired pressure in the process vessel pressure. Desired process conditions determine the magnitude of the excess in pressure in buffer vessel 126. Buffer vessel 126 has a pressure sensor 128. Pressure readings from 128 are relayed to a pressure controller 130. Pressure controller 130 uses readings from 128 to control motor 116 that drives pump 114. In this way, feedback control is used to regulate the pressure in buffer vessel 126. Preferably, buffer vessel 126 is temperature-controlled.

Figure 4:
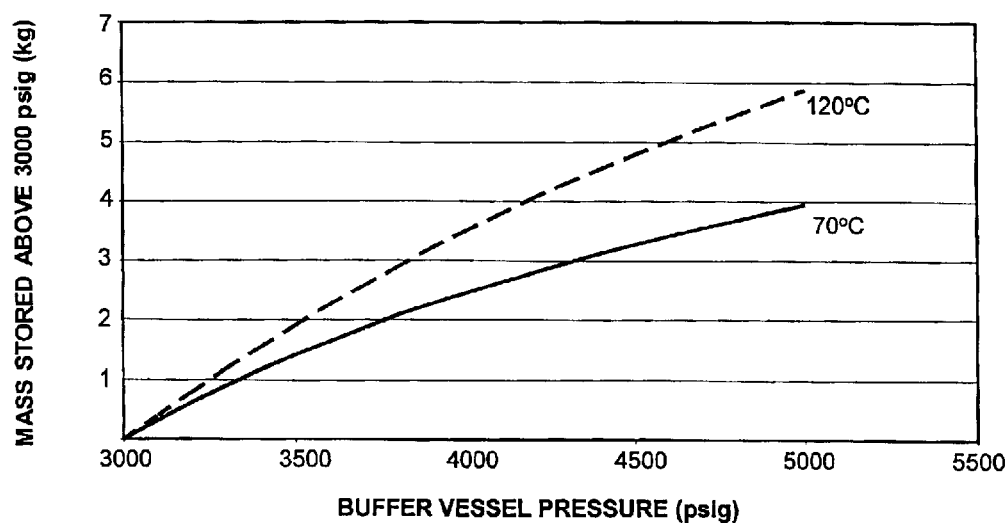
FIG. 4 is a graph of mass of supercritical fluid versus buffer vessel pressure.

The temperature of buffer vessel 126 can be controlled at a temperature value that offers benefits for rapid pressurization of the process vessel 106. For example, it is a known phenomenon in the thermodynamics of supercritical fluids, that higher temperatures yield more compressible fluids. Therefore, the buffer vessel can be held at a temperature higher than that required for the process. The higher temperature permits storage of a larger mass of solvent in the operating pressure range between the process and buffer vessel pressures. FIG. 4 depicts, for example, how increasing the buffer vessel temperature from 70° C. to 120° C. permits storage of 50% more mass of carbon dioxide at between 3000 and 5000 psig.

When process vessel 106 is to be pressurized, a flow control valve, 132, is used to meter supercritical solution from the buffer vessel. A pressure sensor 122 is used to provide feedback to a pressure controller 124. Pressure controller 124 adjusts the position of flow control valve 132 in order to regulate the pressure in pressure vessel 106. In a preferred embodiment, valve 132 is adjusted by pressure controller 124 so that a steady ramp of pressure is maintained until the desired process pressure is reached. In one example, flow is controlled by action of a variable orifice in valve 132. This is accomplished by having an electrical motor adjust the position of a valve stem in the valve body of 132. Flow of supercritical solution through the valve orifice may be controlled by thus varying the orifice size. Alternatively, a pneumatic actuator may be used to adjust the position of the valve stem, thus similarly controlling flow through valve 132.

Thus solvent delivery mechanisms of the invention may pressurize the process vessel either directly as described for FIG. 2, or indirectly using a buffer vessel as shown in FIG. 3. Supercritical cleaning solution from these solvent delivery mechanisms is used to fill a process cavity within process vessel 106 and thus clean a wafer or wafers held within. In a preferred embodiment the supercritical cleaning solution is circulated through process vessel 106 by a recirculation system.

Figure 5:
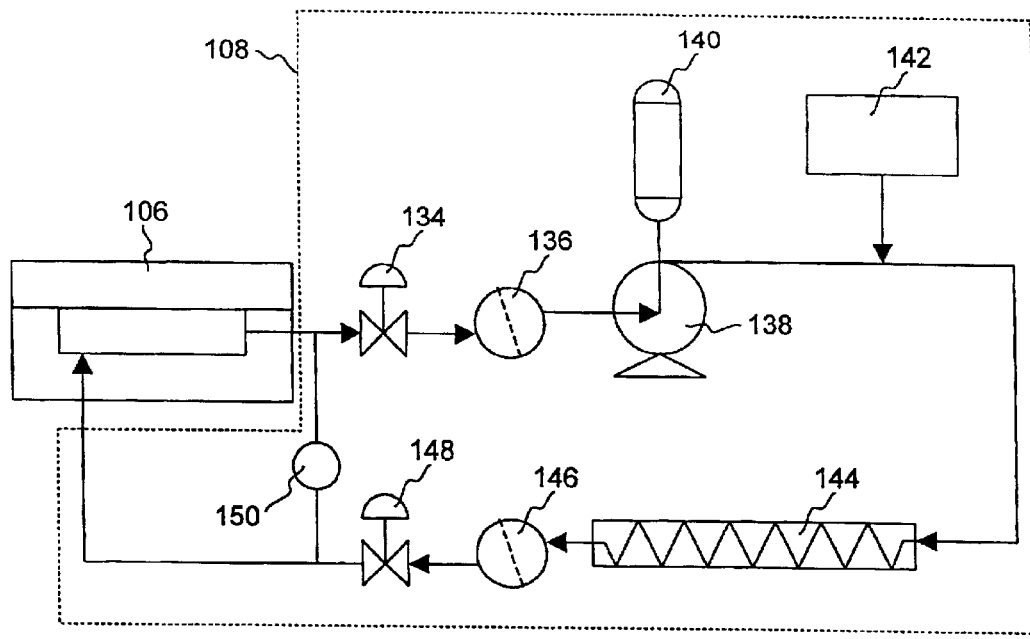
FIG. 5 is a simplified block diagram of a recirculation system in accordance with the invention.

FIG. 5 shows an example recirculation system, 108 (within dotted line area), in fluid communication with the process vessel 106. Preferably, recirculation system 108 recirculates a supercritical solution through process vessel 106 such that a flow field is established over at least one surface of a wafer or wafers contained in process vessel 106. The flow field is mediated by at least (i) the dynamics of recirculation through recirculation system 108, (ii) the shape and design of the process cavity within process vessel 106, and (iii) the number and arrangement of flow plenums and manifolds in process vessel 106. Preferably, recirculation system 108 includes valves for isolating the recirculating system from the process vessel. After process vessel 106 has attained a desired pressure, the supercritical cleaning solution contained within is recirculated over the wafer substrate. This recirculation improves mixing of the residue to be cleaned from the wafer with the cleaning solution. It also enhances the rate at which fresh cleaning solution may be presented to the wafer surface. Another benefit of recirculation of supercritical cleaning solution through process vessel 106, is to permit controlled addition of chemical additives that might be necessary to perform selected residue removal. By adding chemical additives into a flow stream of supercritical cleaning solution, mixing and dissolution of the additives is enhanced. Also, introduction of additives in this manner permits the sequential or simultaneous addition of two or more additives. This is advantageous particularly in those instances where dissolution of one additive in the supercritical solvent may be necessary to increase the solubility of a second or third additive in the same supercritical solvent.

In its recirculation path, supercritical cleaning solution exits process vessel 106, traverses a shut-off valve 134, a filter 136, a pump 138, a static mixer 144, another filter 146, another shut-off valve 148, before re-entering process vessel 106. Valves 134 and 148 serve as isolation valves. Isolation valves are used to isolate the recirculation loop from the process vessel if desired. Filters 136 and 146 are used for removing any particulates that may be contained in the recirculating cleaning solution. Filter 136 is used to prevent particulates removed from the wafer surface from entering the recirculation system. Filter 146 is used to prevent particulates generated in the recirculation system (for example by the pump or precipitation of additives or removed wafer residues) from being deposited on the wafer. Preferably these filters feature accessible filter elements for easy replacement during regularly scheduled maintenance.

Figure 6:
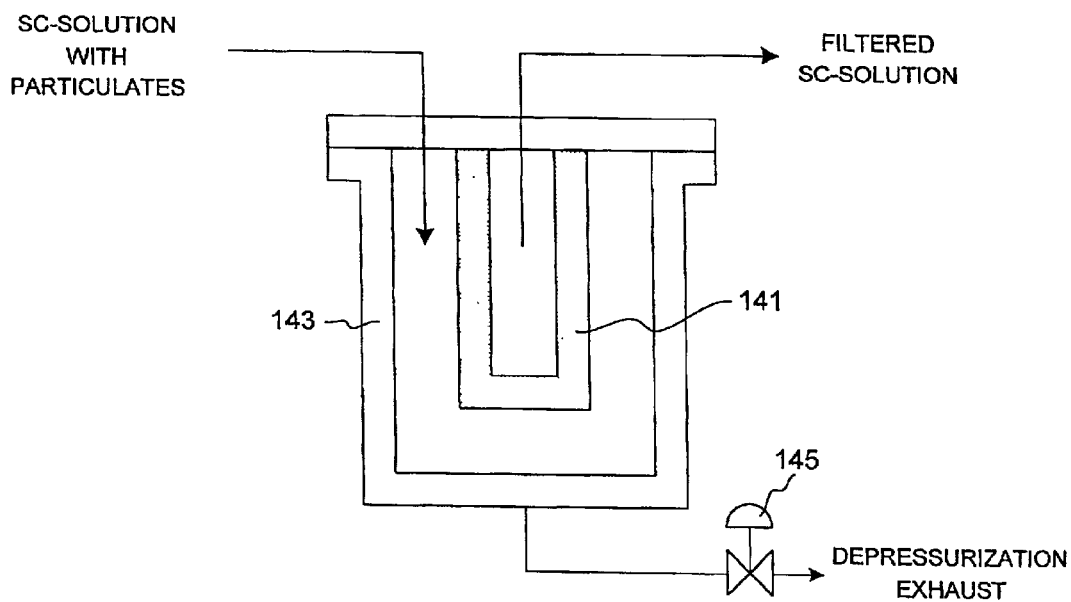
FIG. 6 is a simplified block diagram of a self-cleaning filter in accordance with the invention.

In some embodiments, self-cleaning filters are used, for example for filters 136 and 146. Self-cleaning filters utilize automated methods for dislodging materials that become lodged on the filter elements. FIG. 6 depicts a self-cleaning filter of the invention. A filter element 141 is disposed inside a high-pressure enclosure 143 in such a manner that supercritical solution contaminated with particles flows into enclosure 143 in the annular space between the enclosure and the outer surface of filter element 141. The supercritical solution then flows across filter element 141 lodging the particulate matter onto and in the pores of the filter element. Filtered supercritical solution leaves the filter as indicated by the arrow emanating from the inner space of the filter element. A separate flow line with a valve 145 is connected to housing 143, and is in fluid communication with depressurization system 110 at its exhaust (refer to FIGS. 1 and 11). After a wafer has been processed, the recirculation system is depressurized through the valve 145 causing supercritical fluid to flow through filter element 141 in the reverse direction. This reverse flow dislodges particulates trapped in filter element 141 and prepares the filter for the next wafer (or batch of wafers). Periodically, for example after a pre-defined number of wafers have been processed, filter housing 143 is opened and cleaned to remove all particulates that have been collected.

Referring again to FIG. 5, pump 138 is driven by an electrical motor 140. Pump 138 does not have to generate high discharge pressures but only has to compensate for dynamic flow losses due to recirculation loop or process vessel components. As such, pump 138 can be driven magnetically so as to eliminate shaft seals that may leak at high pressures. As well, centrifugal pump configurations are appropriate for this function.

Chemical additives are introduced into the recirculation system via an additive delivery mechanism 142. In this case, a chemical additive is introduced into the recirculation system where it is added to the supercritical cleaning solution. The mixture of additive and supercritical cleaning solution traverses a portion of the recirculation system (for example) and enters static mixer 144.

Figure 7:
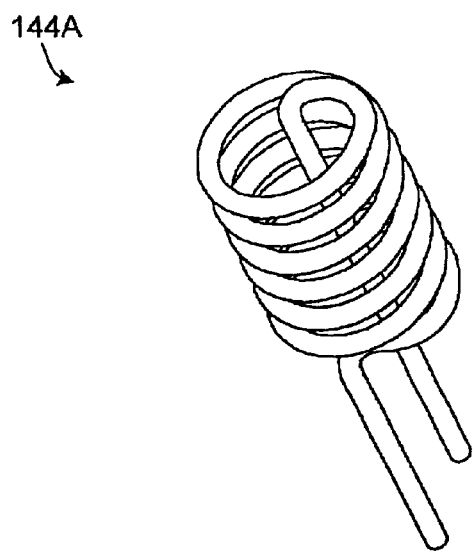
FIGS. 7-8 depict static mixers in accordance with the invention.
Figure 8:
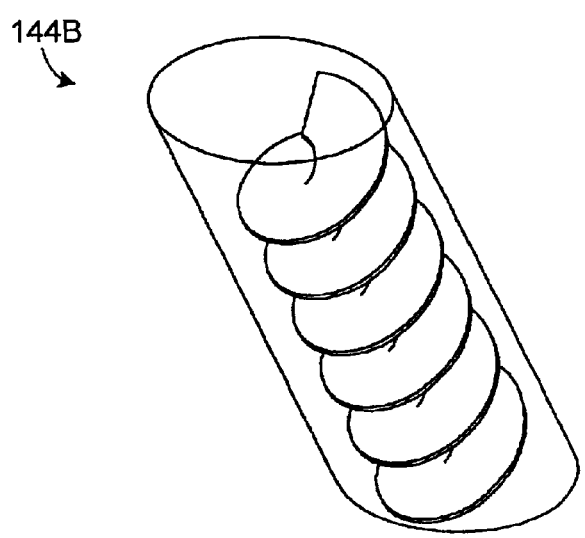

Static mixer 144 is added "in-line" in the recirculation system to ensure proper mixing and dissolution of additives in the supercritical cleaning solution. The static mixer is a device that provides a sufficiently tortuous path for mixing and dissolution of chemical additives. FIG. 7 depicts an example of a static mixer, 144A, in accordance with the invention. Static mixer 144A is a helical coil made of a single tube having an inlet and an outlet. FIG. 8 depicts another example of a static mixer, 144B, in accordance with the invention. Static mixer 144B is a helix introduced inside a cylindrical vessel for static mixing. Each of static mixers 144A and 144B provide a tortuous path which permits entrained chemical additives in the supercritical cleaning solution to atomize by collision on the large surface areas provided by these devices. Since dissolution, in most cases, is controlled by a rate of mass transfer, atomization increases the surface area available for dissolution. For a perfect spherical drop, surface area per unit volume can be estimated by dividing the volume of a sphere into its surface area, according to the following equation:

$$\frac{A}{V} = \frac{4\pi r^2}{\frac{4}{3}\pi r^3} = \frac{3}{r}$$

According to the above equation, surface area per unit volume increases inversely with radius of a sphere. To achieve a high surface area and enhance rate of dissolution, it is desired that the additive be atomized into small droplets. Static mixers, for example as described above, accomplish this.

Figure 9:
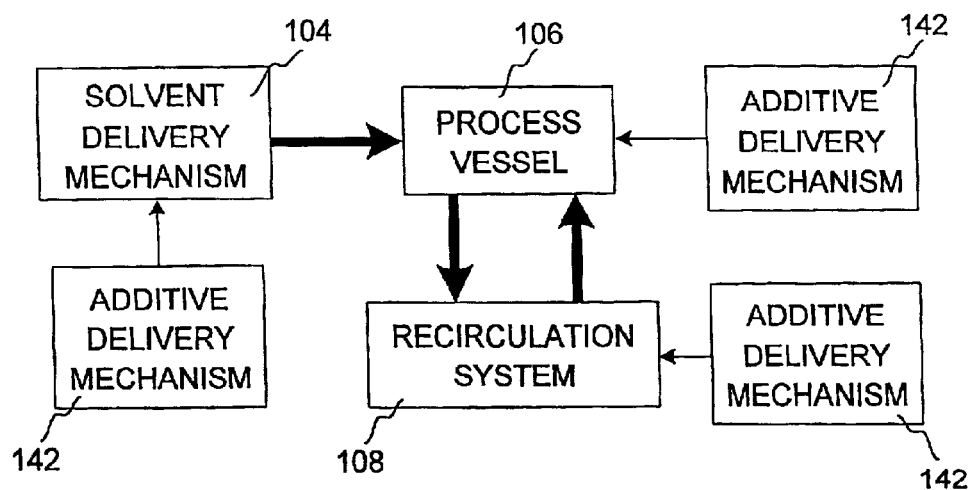
FIG. 9 is a simplified block diagram showing locations of additive delivery mechanisms in accordance with the invention.

As described in relation to FIG. 5, an additive delivery mechanism, 142, is preferably used to add a chemical additive or additives to the recirculation system. Additive delivery mechanisms of the invention may also add chemical additives to other sub-systems of the wafer cleaning system of the invention. As depicted in FIG. 9, an additive delivery mechanism, 142, may add a chemical additive or additives to various components of the wafer cleaning system of the invention. For example, additive delivery mechanism 142 can add a chemical additive directly to recirculation system 108 as described above. Alternatively, 142 may add a chemical additive directly to process vessel 106. As well, an additive delivery mechanism 142 may introduce a chemical additive to solvent delivery mechanism 104 (to sub-critical solvent in dewar 102 or in downstream a feed line containing supercritical solution).

In preferred embodiments of the invention, the additive delivery mechanism 142 adds chemical additives directly to supercritical cleaning solution within these sub-systems. In a particularly preferred embodiment, the additive delivery mechanism adds a chemical additive to the recirculation system as described in relation to FIG. 5. As mentioned, solvent delivery mechanism 104 provides a supercritical cleaning solution to process vessel 106 and recirculation system 108. In some cases however, it can also provide a sub-critical cleaning solution to these components. Therefore, additive delivery mechanisms 142 may add chemical additives directly to a sub-critical liquid phase cleaning solution in any of components 104, 106, and 108.

Figure 10:
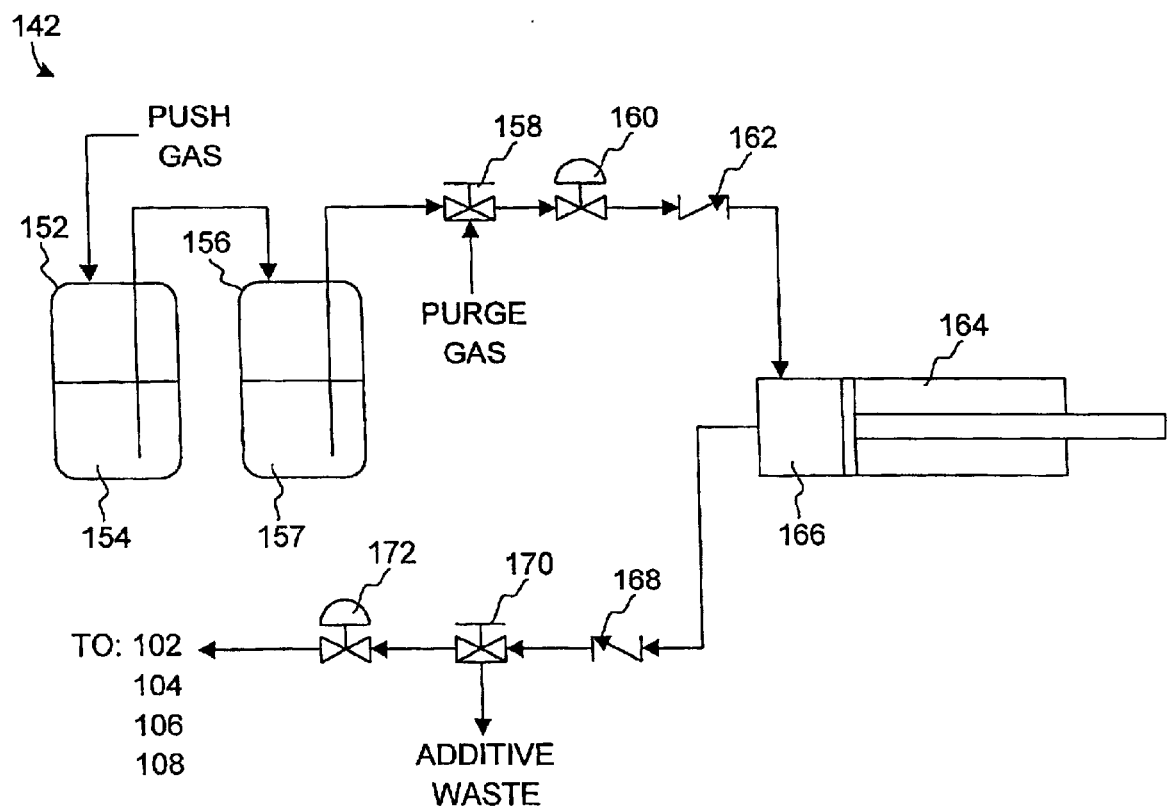
FIG. 10 is a simplified block diagram of an additive delivery mechanism in accordance with the invention.

FIG. 10 shows an example additive delivery mechanism 142 of the invention. Additive delivery mechanism 142 includes a first ampoule 152, a second ampoule 156, a manually controlled valve 158, a control valve 160, a check valve 162, a syringe pump 164, a check valve 168, a manually controlled valve 170, and a control valve 172. In this example, additive delivery mechanism 142 is designed for the addition of liquid phase chemical additives. A solid phase chemical additive may be pre-dissolved into a solution and added via mechanism 142. Additionally, mechanism 142 may be used to introduce gaseous chemical additives into the wafer cleaning system of the invention. Preferably however, gaseous additives are compressed to a pressure substantially similar to that of the supercritical process solution before entering mechanism 142.

In this example, a liquid chemical additive, 154, is depicted. Ampoule 152 holds liquid chemical additive 154. A push gas is used to drive the liquid chemical additive through an eductor tube and into second ampoule 156. Second ampoule 156 is used as a degassing point for the liquid chemical additive. Thus, degassed liquid chemical additive 157 is pushed through an eductor tube and into valve 158. Three-way valve 158 allows introduction of purge gas into the system including syringe pump 164.

One function of three-way valve 158 is to provide introduction of a purge gas into the additive delivery system. This helps to remove traces of additive that are being replaced by an additional additive (solvent or other chemical reagent). In this function valve 158 is positioned to let a purge gas flow through the valve 160, check valve 162, syringe pump 164, check valve 168, and out through the second three-way valve 170 as indicated. Once the flow lines and the syringe pump have been purged of all traces of the old additive, a new additive may be introduced.

Another function of three-way valve 158 is to provide access to a vacuum system, for example, used for removal of oxygen and other unwanted gases. This function may be served by connecting a port of both three-way valves 158 and 170 to a vacuum pump that can then withdraw the gases trapped in the additive injection system.

After leaving second ampoule 156, a liquid chemical additive traverses valve 158, 160, and 162 before entering volume 166 of syringe pump 164. Withdrawal of the barrel of the syringe pump draws the liquid chemical additive through the above-mentioned components and into volume 166. Valves 160 and 172 are controlled by flow controllers (not depicted) of the cleaning system. Check valve 162 is a one-way valve that prevents back flow through the additive delivery mechanism feed line. Once the desired amount of liquid additive is drawn into the syringe barrel, the syringe barrel is pushed inward, driving the liquid chemical additive out of volume 166 and through one-way valve 168, valve 170, and valve 172. After a particular additive is introduced into the supercritical system, the forward motion of syringe pump 164 is ceased, and valve 172 is closed. As shown in FIG. 10, using additive delivery mechanism 142, a chemical additive can be delivered to sub-critical liquid solvent source 102, solvent delivery mechanism 104 (for example in lines supplying supercritical solution to the process vessel), process vessel 106, or recirculation system 108. Preferably 142 is used to deliver additives into systems of the invention while maintaining supercritical conditions within those systems.

Alternatively, three way valve 170 is used to divert chemical additives from entering components of the wafer cleaning system and route them into an appropriate waste stream. This is necessary because delivery mechanism 142 is a one-way flow system. Thus, valve 170 can be used to remove unwanted additives from syringe 164 as well as remove rinse solvents that are used to rinse the system to clean it of chemical additives.

As mentioned, chemical additives (if needed) are introduced into the wafer cleaning system via the recirculation system, the process vessel, or the solvent delivery mechanism, when charged with supercritical solution. In preferred embodiments, the wafer or wafers are cleaned using the supercritical solvent or solution and any additives. After processing of the wafer is complete, the supercritical cleaning fluid (with any additives) has to be removed from the system. Preferably, removal of the supercritical solution from the system is performed by first diluting the solution to remove at least a portion of the chemical additives. After the chemical additives have been removed or diluted sufficiently such that they will not precipitate out of the solvent when vented, then the system is vented. Thus, the system is held under supercritical conditions until the additive is removed or diluted to a desired degree, and then depressurized.

Figure 11:
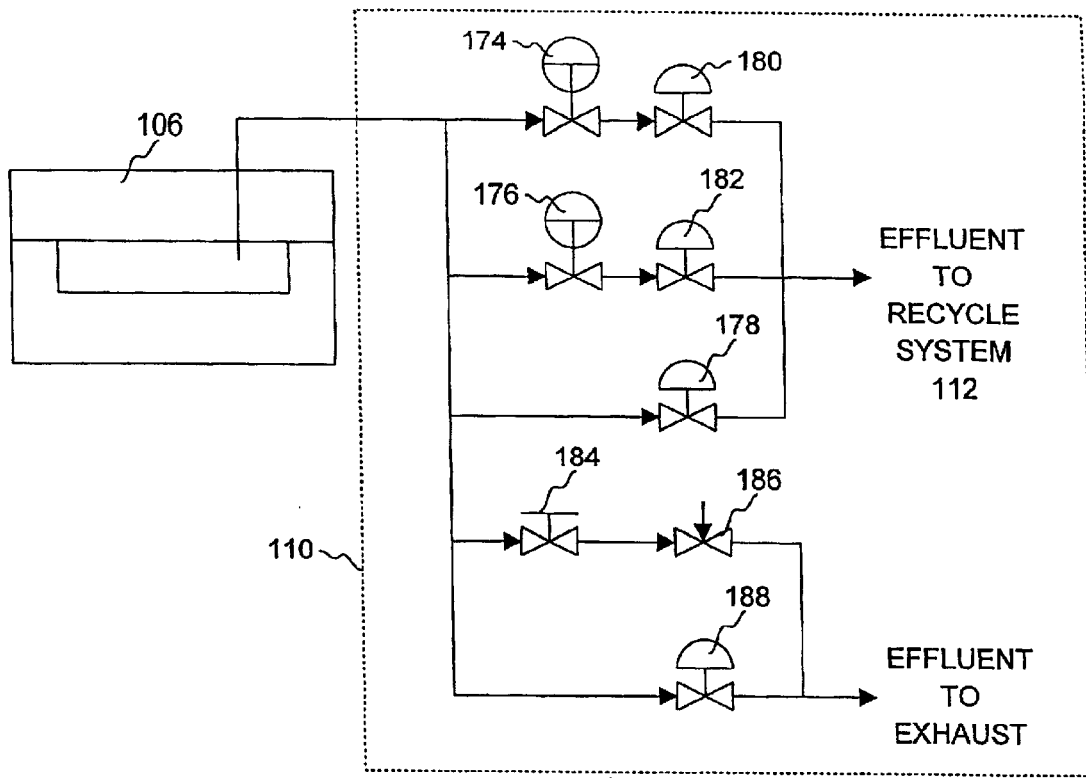
FIG. 11 is a simplified block diagram of a depressurization system in accordance with the invention.

FIG. 11 depicts a depressurization system, 110 (within dotted line area), that can be used to both depressurize the wafer cleaning system of the invention as well as perform dilution of supercritical cleaning solution prior to depressurization. Depressurization system 110 includes a number of valves situated in parallel and in fluid communication with an outlet from process vessel 106. Flow control valve 174 is used for dilution of supercritical cleaning solution in process vessel 106 and permits flow control over small flow rates with large pressures in the process vessel. Flow control valve 176 is for depressurization that permits control over a large flow rate with decreasing pressure in the process vessel. Flow control valve 178 is primarily a bypass valve to augment depressurization of flow when the process vessel pressure drops below a desired value. Thus, control valves 174, 176 and 178 have progressively larger flow coefficients.

Valves 180 and 182 are positive shut-off valves to back up flow control valves 174 and 176, respectively. In this example, supercritical cleaning solution that is vented from process vessel 106 via valves 174, 176, or 178 is delivered to recapture-recycle system 112. In one preferred embodiment, effluent released via valves 174, 176, and 178 is delivered to recapture-recycle system 112 when the effluent pressure is between about 100 and 500 pounds per square inch. Capturing effluent in this pressure range obviates mechanical pumping by the recapture-recycle system. For example, if the sub-critical solvent source is a dewar which holds liquid carbon dioxide at 0° F. and 300 psi, then the effluent stream entering the recapture-recycle system need only be above 300 psi to obviate mechanical pumping. The pressurized effluent is processed by the recapture-recycle system without the need for re-pressurization.

When pressure in process vessel 106 and the recirculation system 108 drops to a value below that required for operation of recapture-recycle system 112 (300 psi in the example above), valves 174, 176, 178, 180, and 182 are closed. Valve 188 is opened to permit the last portion of process fluid to escape from process vessel 106 and recirculation system 108. This last portion is usually not recaptured and recycled, and is considered a consumable in the process. Additionally, valve 188 serves as a safety device that opens if there is a loss of either power or pneumatic control. In this instance, it depressurizes the process vessel, thus returning the system to a safer state. Valve 184 is a hand-operated bypass valve for manual depressurization of process vessel 106 in case of a malfunction. Needle valve 186 is used to control the rate of manual depressurization of the process vessel.

As mentioned, valve 174 in conjunction with, for example, valve 132 of solvent delivery mechanism 104B (as depicted in FIG. 3), can be used to dilute supercritical cleaning solution and thus remove additives. This is done without loss of supercritical pressure within process vessel 106. During dilution, flow control valve 174 is opened to a desired position. This position is selected to set the desired rate of dilution of supercritical cleaning solution contained in process vessel 106, and recirculation system 108. Referring again to FIG. 3, pressure sensor 122 senses the dropping pressure and causes pressure controller 124 to respond by opening inlet flow control valve 132 to let in a fresh charge of supercritical solvent. The pressure controller maintains pressure inside the process vessel at a set point by letting in sufficient supercritical fluid via valve 132 to compensate for the loss of supercritical cleaning solution via valve 174.

Alternatively, this dilution sequence can be actuated using solvent delivery mechanism 104A, as depicted in FIG. 2. In this case, pressure controller 124 responds to a pressure drop indicated by pressure sensor 122 by instructing pump 114 to deliver more pressurized solvent to the heat exchanger and thus create more supercritical solution. The supercritical solution travels from the heat exchanger directly to the process vessel to compensate for the exhausted supercritical cleaning solution. Thus, supercritical conditions are maintained.

In either case, the dilution step may commence immediately after addition of a chemical additive or a predetermined delay (e.g. selected by the operator). The magnitude of this delay depends on specific process needs. The magnitude and duration of the dilution step will also depend on the nature of the additive and its ability to stay in a single-phase mixture with, for example, a supercritical solvent. The dilution is continued until substantially all chemical additives are removed from supercritical cleaning solution or at a suitable point where chance of precipitation of the chemical additive from the supercritical cleaning solution is minimized.

Preferably chemical additive systems are deactivated during the dilution phase. In one embodiment, deactivation is achieved by addition of a neutralizing agent. For example, after processing with concentrated additive systems, a neutralizing agent is introduced, just prior to or during the dilution phase, which inhibits an additive's mechanism of action. Put another way, a "stop agent" may be introduced, to inhibit the action of the previously introduced additives, preferably at the beginning of and/or during dilution of previously introduced additives. In a particularly preferred embodiment, deactivation of additive systems is achieved via dilution of the additive systems.

Figure 12:
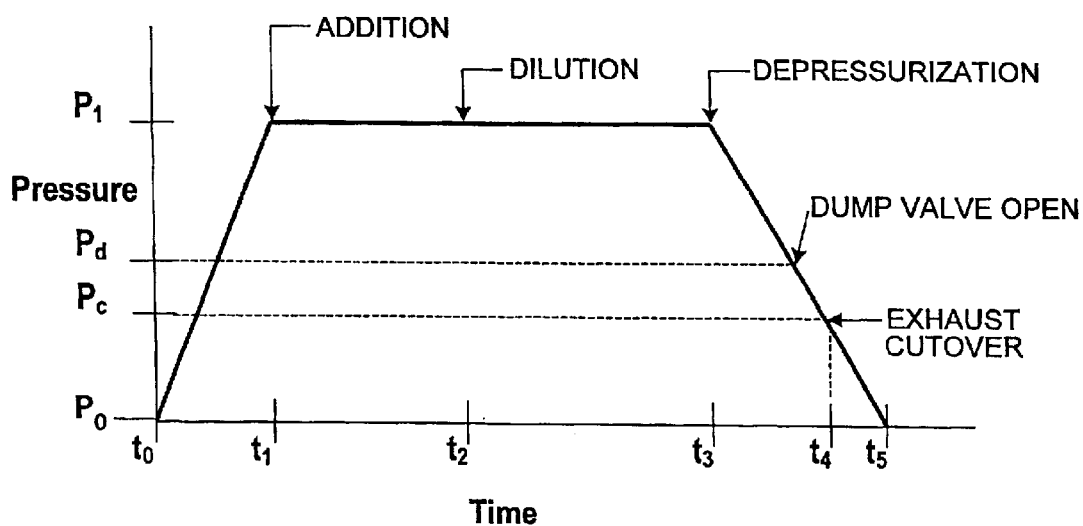
FIG. 12 is a graph showing pressure vs. time in accordance with wafer cleaning methods of the invention.

FIG. 12 depict s a pressure versus time curve for an exemplary cleaning process cycle of the invention. This example is given as a supplement to the description of the depressurization and dilution system of FIG. 11. Referring to FIG. 12, at the origin of the graph is time to at a point where the pressure in the process vessel is sub-critical $P_0$. During the pressurization phase, all valves of depressurization system 110 are closed. Process vessel 106 is pressurized to a supercritical pressure $P_1$ at time $t_1$. In this example, addition of chemical additives is performed as soon as the desired supercritical pressure within process vessel 106 is reached. It may be desired to have a delay between the time supercritical pressure is reached and chemical additives are introduced into the system.

Referring again to FIG. 12, the time period between $t_1$ and $t_2$ is when most if not all of the wafer's exposure to any chemical additives in the supercritical solution occurs. In this example, a constant pressure is depicted for this time period. Alternatively, the pressure during this time period can be pulsed using particular pulse sequences. This will be described in more detail below. Importantly, referring to FIG. 11, during addition of chemical additives, valve 180 is opened and valve 174 is controlled so as to maintain constant pressure in the process vessel (refer to description of FIG. 3 feed back control above). During this feedback control, all other valves in the depressurization system (besides 174 and 180) remain closed. Controlled venting via valve 174 is necessary to compensate for any pressure build up that may occur due to additive injection. Conversely, if injection of an additive causes pressure in the process vessel to drop, pressure controller 124 instructs valve 132 to open, thus letting in more supercritical solvent fluid. In the additive system 104A, pressure controller 124 instructs pump 114 to deliver more supercritical solvent directly via heat exchanger 118.

As mentioned, after addition of chemical additives and the wafer's exposure to any chemical additives in the supercritical solution, dilution of the supercritical cleaning solution is performed. This is represented in FIG. 12 starting at time $t_2$. During dilution, valve 180 is opened and valve 174 is controlled in a feedback manner as described above, to maintain constant pressure in process vessel 106. During dilution, all other valves in the depressurization system (besides 174 and 180) remain closed. One skilled in the art would understand that such dilution can also clean contaminates from a wafer (in addition to exposure to chemical additives in a supercritical solution). Therefore dilution is included in cleaning methods of the invention.

In another embodiment, simultaneous dilution and chemical addition are employed. For example, fresh (pure) carbon dioxide is introduced through valve 132 (refer to FIG. 3) simultaneously with the injection of one or more chemical additives by additive delivery mechanism 142. Valve 180 of the depressurization system 110 (refer to FIG. 11) is kept open while valve 174 is controlled so as to maintain a substantially constant supercritical pressure inside the process vessel 106. The purpose of this method is to present a continuing supply of fresh chemical to the wafer, while simultaneously withdrawing spent chemical. Concurrently with this process, pressure in the process vessel is maintained at a sufficiently high value to provide a single supercritical phase solution. After the desired exposure period has expired, a dilution phase such as that described in the previous paragraph is commenced.

After dilution is complete, depressurization can commence. This is represented in FIG. 12 as time point $t_3$. During depressurization, valve 180 and valve 174 are closed. Valve 182 is opened and valve 176 is controlled in a feedback manner as described, to maintain a linear ramp down in process vessel 106 pressure. All other valves remain closed during depressurization. During the linear ramp down and pressure, at a point of desired pressure $P_d$ as depicted in FIG. 12, dump valve 178 is opened to augment valve 176. At this point exhausting effluent is still delivered to the recycle recapture system 112. Once the pressure reaches a desired point (for example <300 psi) there is a cutover to the exhaust. This is represented in FIG. 12 as pressure $P_c$ at time $t_4$. At pressures below $P_c$ in the linear pressure ramp down, effluent is no longer delivered to recapture-recycle system 112. At cutover pressure $P_c$, valves 178, 180 and 176 are closed. Valve 188 is opened to redirect chamber effluent from the recycle-recapture system to an exhaust line.

Figure 13:
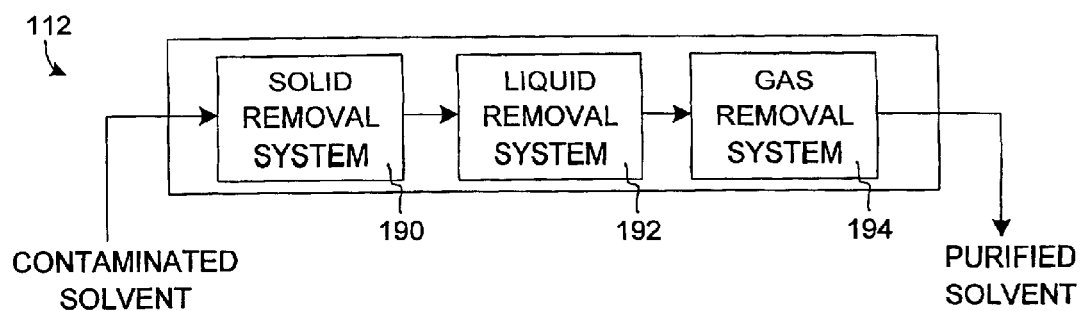
FIG. 13 is a simplified block diagram of a recapture-recycle system in accordance with the invention.

As mentioned, effluent from venting of process vessel 106 is directed to recapture-recycle system 112. Recapture-recycle system 112 is used not only to capture this effluent but also to purify at least a portion of it for reuse, preferably by the solvent delivery mechanism 104. Supercritical cleaning solution vented into recapture-recycle system 112 may contain chemical additives and contaminants that were cleaned from the wafer surface. These additives and contaminates may be solids, liquids or gases. Recapture-recycle system 112 is designed to remove all three physical forms of contaminates and additives from the effluent. FIG. 13 shows an example of recapture-recycle system 112. In this example, contaminated solvent effluent from depressurization system 110 travels through a solid removal system 190, a liquid removal system 192, and a gas removal system 194. After solid, liquid, and gaseous contaminates are removed from the effluent, a purified solvent or solvents are obtained. Recapture-recycle systems of the invention include at least one of the solid, liquid, or gas removal systems as depicted in FIG. 13.

Effluent released from depressurization system 110 may contain contaminates in solid, liquid or gaseous form. Depending on the solvent used to generate the supercritical cleaning solution, the effluent can be in a gaseous form or a liquid form. In the following description of solid, liquid, and gas removal systems of the invention, the effluent will be referred to as a solvent. Following are descriptions of specific embodiments of solid, liquid, and gas removal systems of the invention.

Figure 14:
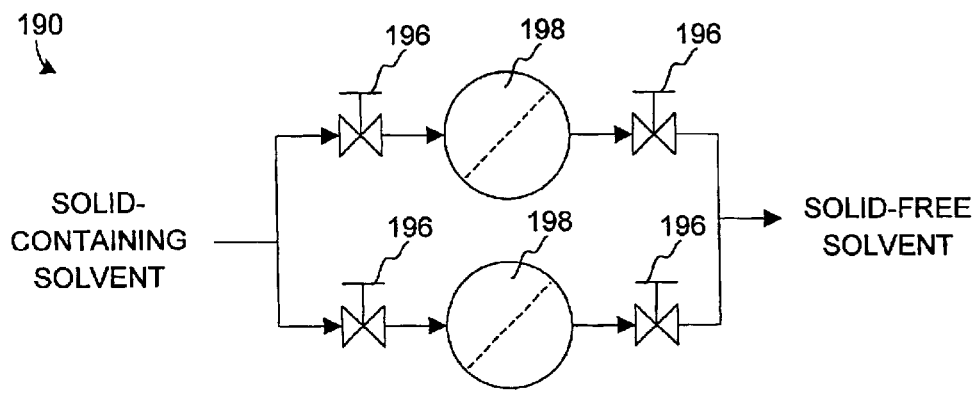
FIG. 14 is a simplified block diagram of a solid removal system in accordance with the invention.

FIG. 14 shows a solid removal system, 190, in accordance with the invention. As depicted, solid-containing gaseous or liquid solvent is fed into apparatus 190 that has two filtration systems in parallel fluid communication. The solvent travels through valves 196, filters 198, and then finally through valves 196 before the two flow lines converge to provide a single source of solvent which is free of solids. Filtration occurs by passing the contaminated solvent through a porous material. The pore size is selected to preferentially retain most if not all solids. Apparatus 190 permits continuous operation by adding two filter modules 198. In this way, one can be replaced or maintained (via isolation valves 196) while the other is in use. In another embodiment, sequential filters are used. In this case, two or more filters are used in series, each progressively decreasing pore size. Thus, for example, a coarse filter with a pore size of 10 microns may be used before a fine filter with pore size 1 micron. This prevents premature clogging of the finer filter. Again referring to FIG. 13, the solid-free solvent, having passed through solid removal system 190, travels next to a liquid removal system 192.

Figure 15:
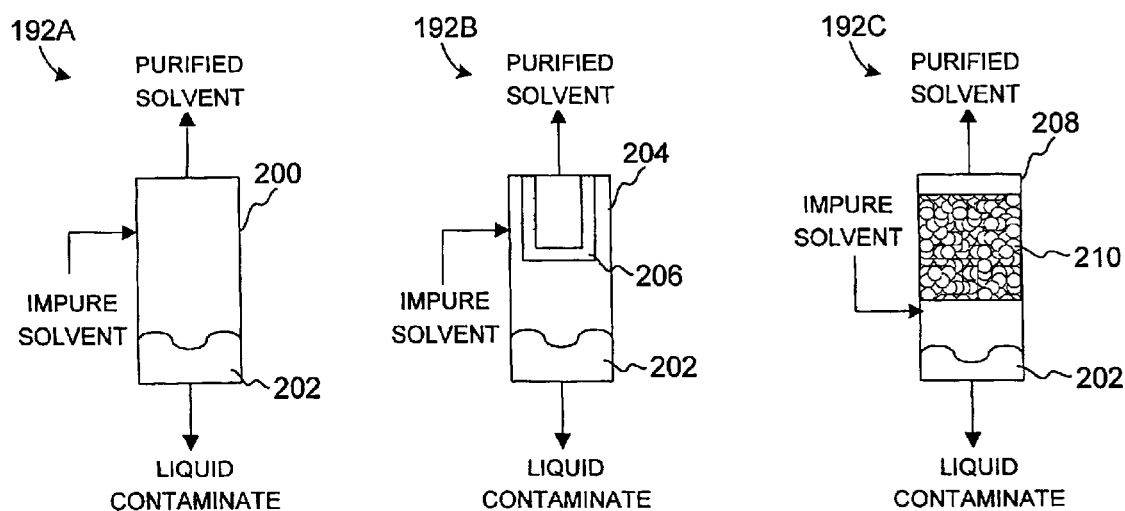
FIG. 15 is a simplified block diagram of a liquid removal system in accordance with the invention.

FIG. 15 depicts three examples of liquid removal systems 192A, 192B, and 192C of the invention. Many liquid contaminates can be captured by filtration systems designed for solid contaminates as described above. However, to treat those liquid contaminates that can escape system 190, other phase separation devices can be used to separate liquids from, for example, gaseous solvent. Preferably gravity is used to separate the liquids from the lighter gases. Referring to liquid removal system 192A, impure (in this case, liquid-containing) solvent enters a chamber 200. Gravitational force makes liquid impurity 202 flow to the bottom of chamber 200. Liquid contaminate 202 can be removed from chamber 200 via a valve (not shown) at the bottom of chamber 200. The gaseous solvent travels through the top of chamber 200 via an outlet. The solvent is purified by virtue of the phase separation of the liquid contaminate from the gaseous solvent.

To trap liquid droplets dispersed in a flow of predominately vapor solvent, various coalescing media are employed. These may include column packing or porous beds to separate the incoming dispersed liquid contaminate and gaseous solvent. Referring to liquid removal system 192B, impure solvent enters a chamber 204 which contains a coalescing media 206. In this example, coalescing media 206 is formed into a rigid structure through which the impure solvent must traverse in order to exit vessel 204. As the impure solvent traverses 206, liquid contaminates coalesce on it and drop down to the bottom of chamber 204 as depicted (to form liquid pool 202). Purified solvent traverses coalescing media 206 easily and exits chamber 204. Referring to liquid removal system 192C, impure solvent enters a vessel 208 which is packed with beads of a coalescing media, 210. In this case the beads provide a large surface area to coalesce liquid impurities and allow them to drop to the bottom of vessel 208 via gravitational force. The solvent passes through the beads in gaseous form and exits chamber 208 at the top in purified form.

Liquid removal systems 192 are simple systems which do not contain any heating elements or cooling elements to either boil or condense the liquid phase impurity in the solvent. In the case that contaminates have a high vapor pressure, it can co-exist with the solvent in the vapor phase. Separation of such impurities can be accomplished by gas removal systems of the invention.

Referring again to FIG. 13, once the solvent is free of solid and liquid contaminates, having traveled through solid removal system 190 and liquid removal system 192, the solvent then enters gas removal system 194. Since the remaining contaminates in the solvent (e.g. a gaseous solvent) co-exist in the vapor phase with the solvent, one way to separate the two components is to first condense them into a liquid phase and then separate them via distillation.

Figure 16:
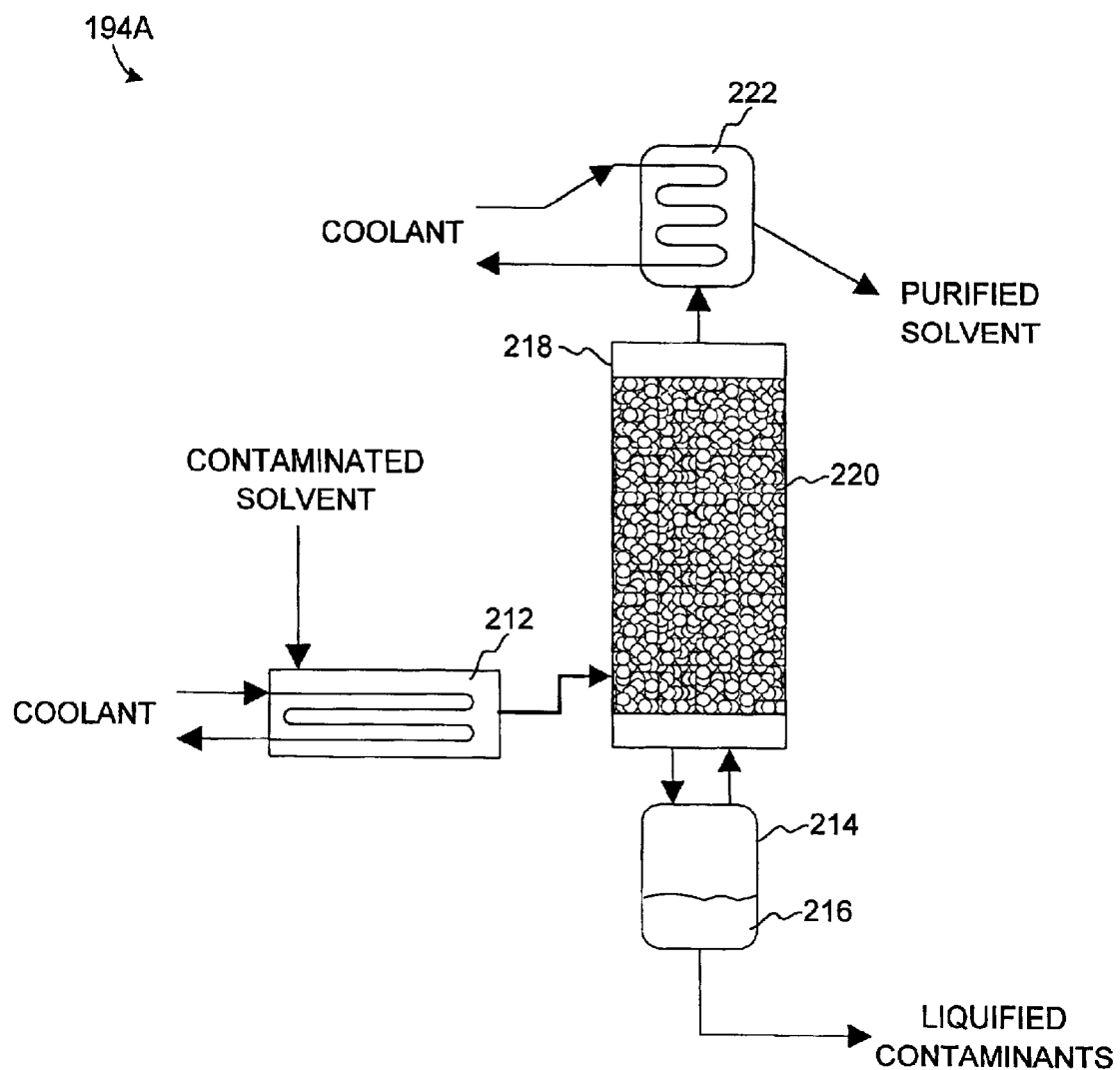
FIG. 16 is a simplified block diagram of a gas removal system in accordance with the invention.

FIG. 16 depicts one example of a gas removal system, 194A, which uses distillation to separate gaseous contaminates from the gaseous solvent. In this case, the contaminated solvent first enters a condensing unit 212. This unit can work in two ways depending on the relative volatility of the contaminant and solvent. In cases where the contaminant has a higher vapor pressure (or lower boiling temperature), the solvent is condensed in unit 212. The mixture of liquid solvent and gaseous contaminant is then introduced into the distillation column 218. This column is packed with coalescing media 220 that is designed to produce the optimal number of theoretical plates. As in the example described above, the liquid solvent coalesces into larger droplets and is drained to the bottom of the column 218 by gravity. The liquid solvent 216 is then collected in the re-boiler 214 which is maintained at a suitable temperature whereby, any contaminate that may have condensed is boiled off. The liquid solvent 216 may be drawn off for further use from the bottom of re-boiler 214 via a valve (not shown in FIG. 16). The contaminant, which in this example is in the vapor phase, rises through distillation column 218 and encounters the re-condenser 222. The re-condenser is maintained at a suitable temperature whereby any solvent that may still be in the vapor phase is condensed. Solvent condensed in the re-condenser 222 will then drain by gravity through the coalescing media 220 of the distillation column 218 and reside in the re-boiler 214 of this unit. Gaseous contaminate will then exit the top of the recondenser 222 and be vented to a suitable scrubber. In this example, the re-condenser 222 is maintained a carefully controlled temperature, which is lower than that of the re-boiler 214.

In cases where the contaminant has a lower vapor pressure (or higher boiling temperature) the process described in the previous paragraph is performed in reverse. In this example, the purified solvent is drawn off the top of the re-condenser 222. Liquefied contaminate resides at the bottom of the re-boiler 214 and is drawn off for disposal via a valve. In this case further condensation of the purified solvent is necessary before it can be reintroduced into the Dewar 102 of the solvent delivery system 104 (refer to FIGS. 2 and 3).

Another way to remove gaseous contaminates from a solvent is by the use of semi-permeable membranes. Hollow fiber technology has improved the efficiency with which membranes can be packaged. Membrane separations of the invention take at least two forms. In the first form, the membrane material is selected to be highly permeable to the solvent. The solvent defuses rapidly through the membrane material, while the undesirable component, typically contaminates, are retained and directed to exhaust. In the second form, the membrane is chosen such that contaminates defuse rapidly through the membrane material, while the solvent is retained and collected.

Figure 17:
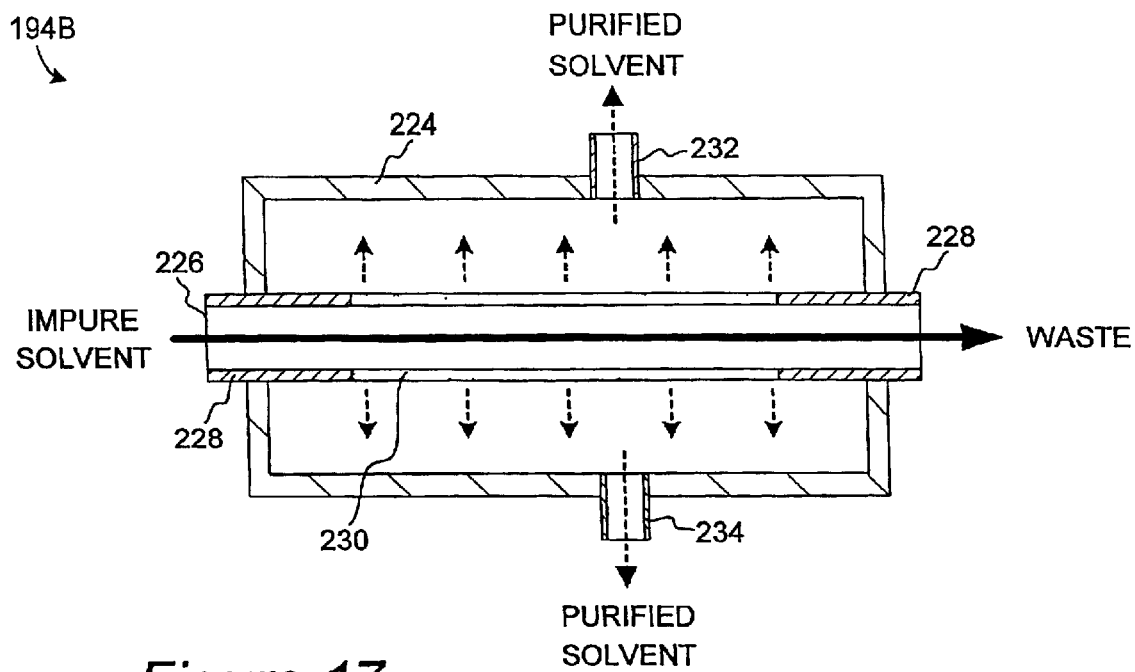
FIGS. 17-18 are simplified block diagrams of purification systems that use semi-permeable membranes in accordance with the invention.

FIG. 17 depicts a gas removal system, 194B, in which a membrane material permeable to the solvent is used. Gas removal system 194B has a housing, 224, through which a tube 226 traverses. Tube 226 is a composite made of two materials. First, a housing material 228; and second, a membrane material 230. One skilled in the art would understand that other arrangements of such materials can be used without diverging from the scope of the invention. In this example, membrane material 230 is permeable to a gaseous solvent but impermeable to a gaseous contaminate. Impure solvent traverses tube 226 and the gaseous solvent passes through membrane 230 while the contaminate does not. The gaseous solvent that passes through membrane 230 is collected in the interior region of chamber 224 and collected via outlet 232. In some embodiments, chamber 224 is cooled so that the solvent can be condensed and collected via gravity through outlet 234. Since membrane 230 is impermeable to contaminates, contaminated gaseous waste travels through tube 226 and exits chamber 224. This method works best when the membrane material 230 has a very high selectivity for one component, preferably the solvent. The selectivity must be high when compared to all other components, for example the contaminates.

As mentioned, another way to use semi-permeable membrane technology is to use such membranes in combination with an absorption medium that has a high affinity for the contaminate or contaminates, and can thus partition the contaminates from the solvent. Typically, the contaminated solvent is passed on one side of a membrane, while a suitable absorptive medium is passed on the other side of the membrane. Contaminate species that have an affinity for the absorption medium travel through the membrane and are absorbed into the medium. The solvent, which is not able to traverse the semi-permeable membrane, travels along the membrane and is purified by virtue of removal of the contaminates through the membrane and into the absorption medium.

Figure 18:
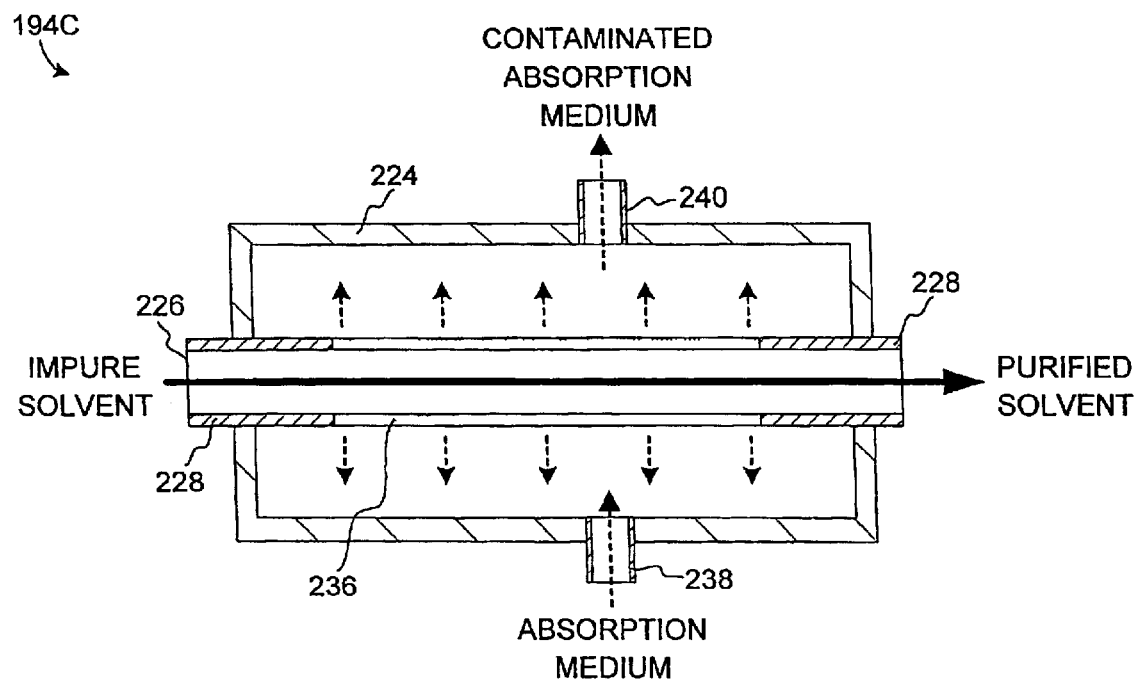

An example of a gas removal system, 194C, which uses this technology is depicted in FIG. 18. Gas removal system 194C looks very much like gas removal system 194B depicted in FIG. 17. In this case, the difference is that the semi-permeable membrane used in 194C is not permeable to the solvent but rather only permeable to contaminates. Gas removal system 194C has a chamber 224 and a tube that traverses the chamber 226 which is comprised of two materials, a highly material 228 and a semi-permeable membrane 236. In this case, the inner space of housing 224 is filled with an absorption medium, for example water. The water travels through inlet 238 to fill housing 224 and exits via an outlet 240. As impure solvent traverses tube 226, contaminates traverse semi-permeable membrane 236 and are absorbed into the water. Contaminates are carried off in the flow of the water through housing 224. The purified solvent continues to traverse 226 and is collected in pure form at the outlet of the tube. An example of this would be where a gas, such as $CO_2$ is contaminated with a solvent such as ethanol in gaseous form. In this case, the ethanol traverses membrane 236 and is readily absorbed into the water and displaced. The purified $CO_2$ travels across membrane 236 without penetrating it. The result is that the solvent is purified. Such apparatus work best when the solvent is overwhelmingly contaminated with one species, which has a higher affinity for a third medium. Example contaminates include polar organic molecules such as alcohols (e.g. methanol, ethanol, etc.), amines (e.g. ammonia), carboxylic acids (e.g. acetic acid), amides (e.g. dimethylformamide), sulfoxides (e.g. dimethylsulfoxide), and phosphoramides, which will dissolve readily in water. Preferably, the water is purified and reused to minimize environmental impact of such a process. Membranes used in such apparatus and methods should be highly permeable, preferably having a microporous structure. If water or an aqueous medium is used for absorption, the membrane should be hydrophobic which allows for stabilization of a liquid-vapor interface at the pores on one side of the membrane. Because of the high density of pores and the high packing density of membrane surface area, a very large interfacial area can be obtained in very small physical packages.

Figure 19:
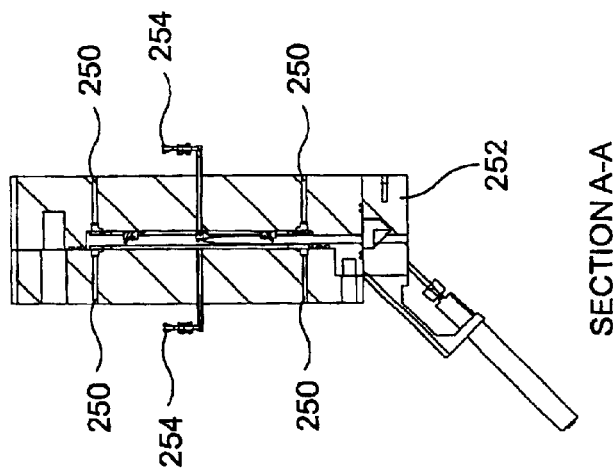
FIG. 19 depicts various views of a process chamber in accordance with the invention.
Figure 19:
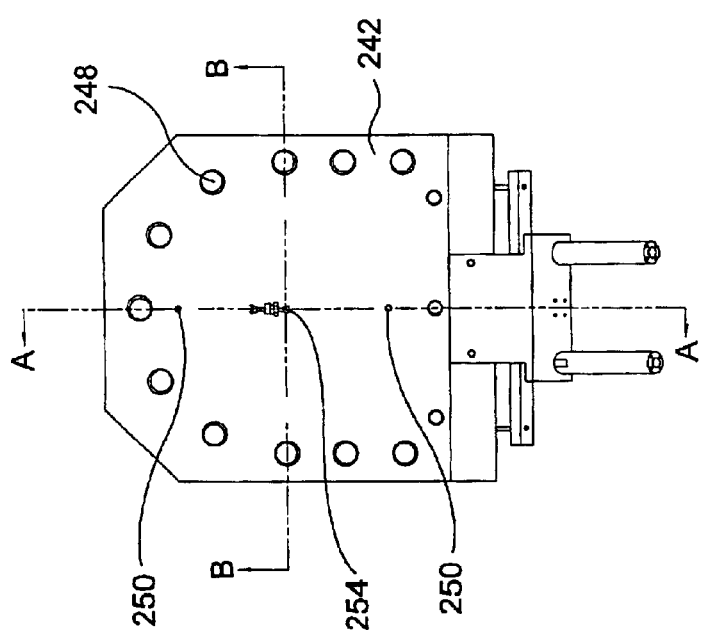
Figure 19:
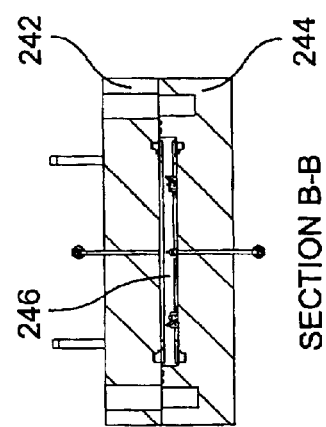

As mentioned, yet another aspect of the wafer cleaning system of the invention is a process vessel. For the invention, a process vessel is: any chamber that can hold a wafer with at least a portion of its surface exposed, can withstand the pressure and temperature of the supercritical cleaning solution, contains a port to allow wafers to be introduced and withdrawn, and contains inlets and outlets to allow the supercritical cleaning solution to flow through and clean the wafer. Preferred embodiments of the invention will have more features than described above. Depicted in FIG. 19 is an example process vessel, 106, in accordance with the invention. Depicted are a top view and two cross sectional views (A—A, and B—B) of process vessel 106. Process vessel 106 includes a process cavity 246 formed by mating of two parallel plates that are bolted together and sealed against one another. Threaded fasteners such as bolts or nuts mounted to threaded studs are used to capture one plate against the other. Shown in the top view are bolt holes 248 and fluid inlets 250 and fluid outlets 254. Referring to cross section B—B, process cavity 246 is seen as well as top plate 242 and bottom plate 244. Referring to section A—A top plate 242 is mated to bottom plate 244. Each of top plate 242 and bottom plate 244 have a supercritical cleaning solution outlet 254 and inlets 250. Other outlets and configurations of outlets are possible without escaping the scope of the invention.

The process vessel is preferably made of a material that is able to withstand substantial pressures afforded by supercritical processing conditions as well as offer corrosion resistance. Preferably such materials include at least one of hastelloy, stainless steel, aluminum, titanium, and other nickel-iron alloys.

Supercritical cleaning solution enters the process cavity via inlet 250, circulates through the cavity creating a flow field over the wafers to clean them, and exits through outlets 254 in each of the top and bottom plates. Also seen in Section A—A is a chamber door assembly 252. Chamber door assembly 252 allows insertion of a wafer into the process cavity 246, and withdrawal of the wafer after cleaning. Process vessel 106 is designed to hold a single wafer during cleaning. In other preferred embodiments of the invention the process vessel is designed to hold a plurality of wafers, preferably in a cassette format so that many wafers can be inserted and withdrawn simultaneously.

Figure 20:
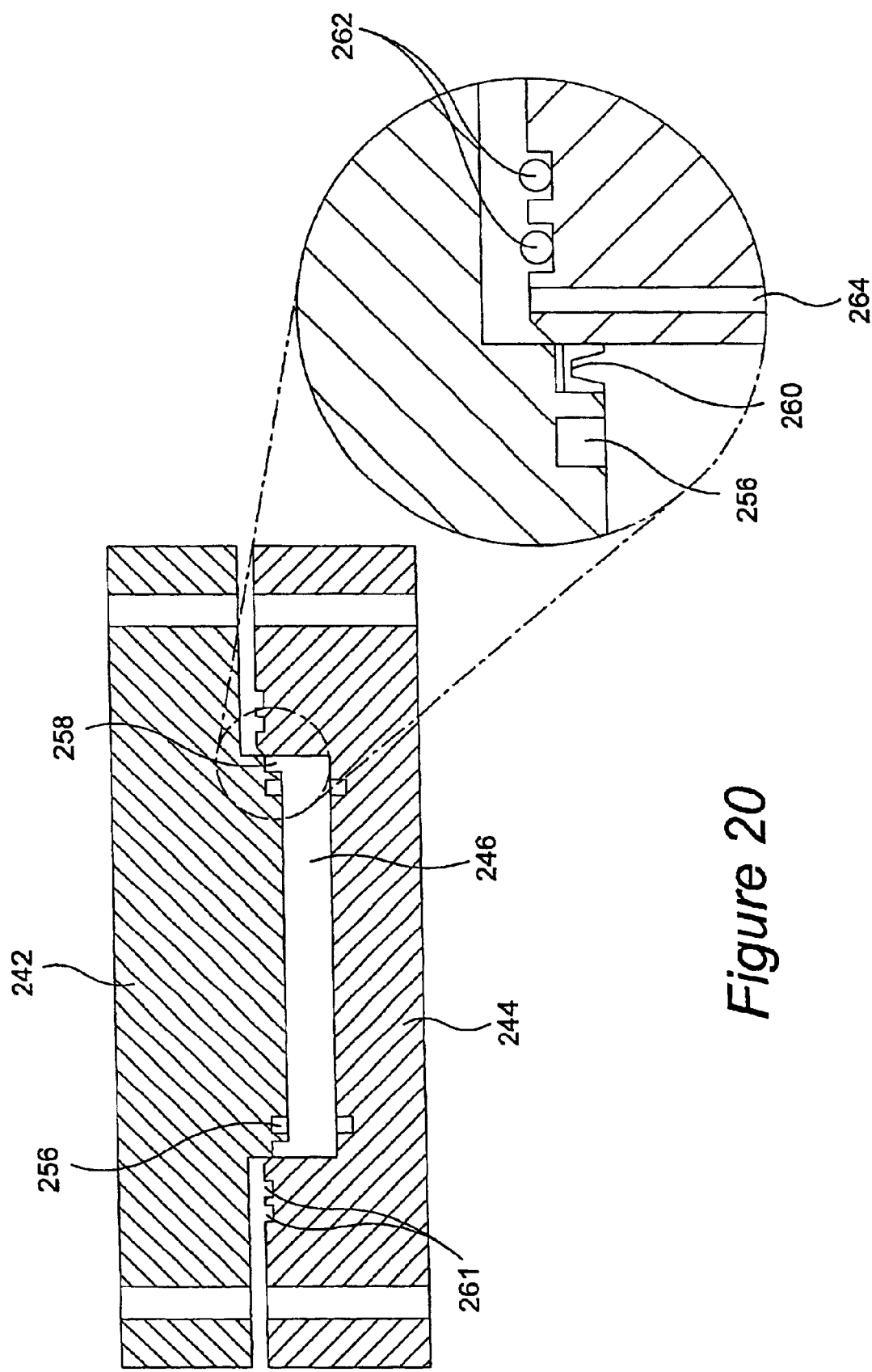
FIGS. 20-21 depict cross-sections of seals in accordance with the invention.

As mentioned, process vessel 106 forms a process cavity when top plate 242 is mated with bottom plate 244. In order for the process cavity to hold a supercritical cleaning solution, a fluid-tight seal must be established between the top and bottom plates. FIG. 20 shows an example sealing mechanism for the process vessel. In this example, top plate 242 contains a primary seal groove 258 and bottom plate 244 contains secondary sealing grooves 261. In the detailed portion of FIG. 20, it can be seen that primary seal groove 258 contains a bore seal 260. In this case the bore seal is a spring energized U-cup type seal. Back up seal grooves 261 contain back up seals 262, in this case O-ring seals. Also seen in the detail of FIG. 20 is a leak detection port 264 which is part of bottom plate 244. Also, each of the top and bottom plates has a flow plenum 256 for supercritical cleaning solution.

Figure 21:
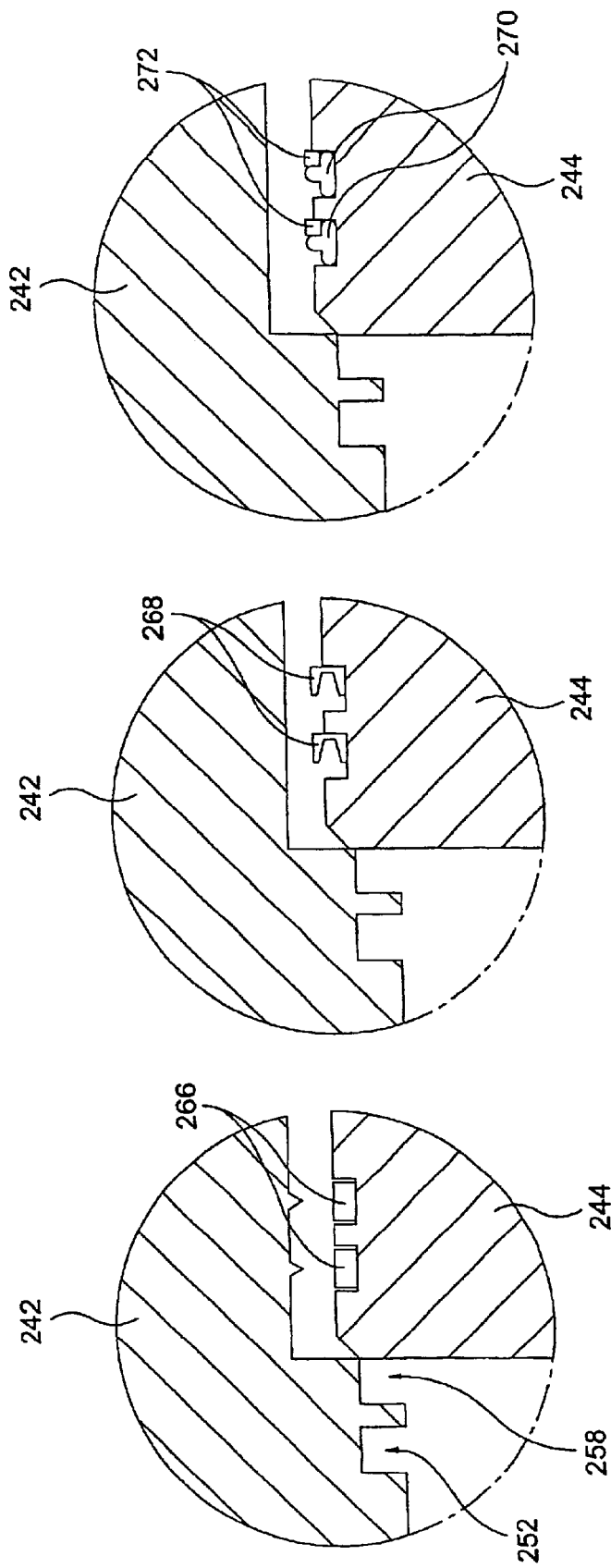

Bore seal 260 is a pressure-energized cup made from an elastomeric material. This seal is employed around the circumference of a cylindrical shoulder on top plate 242 that is inserted in a cavity on the bottom plate to form the process cavity. As mentioned, seal 260 performs better as the internal process vessel pressure increases because the process fluid forces the elastomeric material of seal 260 to conform to the metal walls of the cavity. This force seeks to better the seal and reinforce its sealing capability. Additionally, a metal spring is included in the cup of this bore seal to provide sealing at low pressures. The metal spring also seeks to force the elastomeric material of the seal against the walls of its cavity, thus providing for better sealing until the process vessel pressure itself takes over the sealing function. Preferably the elastomeric material of seals of the invention includes at least one of Chemraz, Kalrez, silicone, Viton, EPDM (Ethylene Propylene Diene Monomer), teflon, polyurethane, and the like. As mentioned, to supplement the primary bore seal one or more secondary face seals may be employed on the flat portions of the interface between the top and bottom plates. These face seals may be constructed using traditional O-rings as shown above, or other kinds of gaskets. FIG. 21 shows a few examples of face seals of the invention. Including O-rings as shown in FIG. 20, metal gaskets, cup seals, and T-seals with back-up seals are used.

Leak detection ports may be drilled into the top and bottom plates to sense for failure of one or more seals. These ports connect an annular space between adjacent primary and secondary seals to a threaded connection on the outer surface of the top or bottom plate. By placing the leak detection port between the primary and secondary sealing, failure of the primary seal can be detected before failure of the secondary seals.

Referring again to FIG. 21, metal gaskets 266 may be employed in bottom plate 244. In this case top plate 242 will have complementary raised surfaces which pierce seals 266 when the plates are mated. In this case the material that top plate 242 is made of is preferably substantially harder than metal gaskets 266. Preferably metal gaskets 266 are made of materials including at least one of aluminum, brass, copper, stainless steel, nickel, and the like. For example, if the metal gasket is made of aluminum, then the top plate can be made of stainless steel.

Alternatively, bottom plate 244 may contain U-cup type seals 268. These cups, as were the primary seal U-cups, may be spring energized as well. Secondary seals 268 are made of the same materials as the primary U-cup seals described above.

Another preferred secondary seal is a T-seal 270 with a complimentary back up ring 272. in this complimentary sealing system, the T-seal is compressed into the grooves of bottom plate 244 and the back up ring 272 provides an additional support mechanism for a portion of the T-seal proximate the exterior perimeter of the plate. In this way, each of the T-seal and back up ring combination provides a secondary sealing element. The back up ring prevents extrusion of the T-seal between the gap between the top and bottom plates. T-seals of the invention are made of the same elastomeric materials mentioned above in relation to the primary seals of the invention. Back up rings are preferably made of harder materials than the elastomers of the T-seal so that they can compress a portion of the T-seal as described. Preferably the back up seals are made of a material including at least one of fiberglass-reinforced plastic, PVC, PVDF/Kynar, Delrin, and the like.

Figure 22:
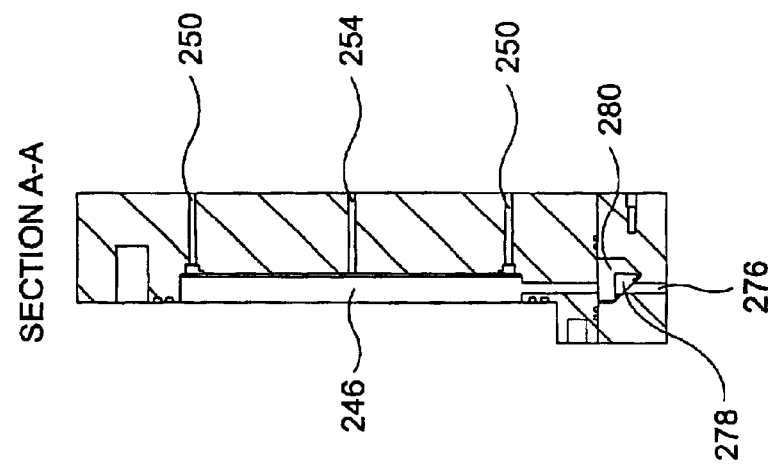
FIG. 22 depicts various views of a door mechanism in accordance with the invention.
Figure 22:
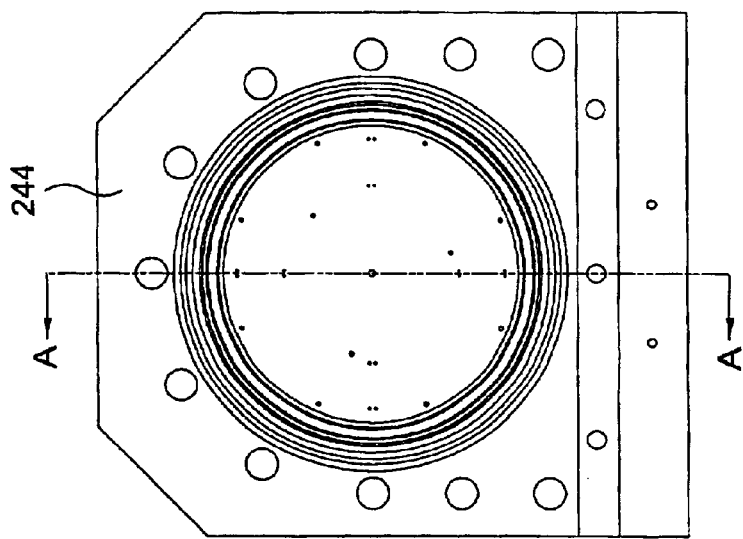
Figure 22:
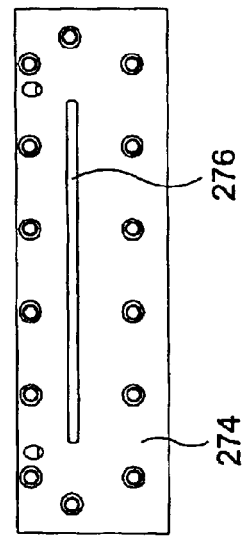

As mentioned, a wafer is inserted into the process cavity via a door mechanism. FIG. 22 shows the door assembly 252, which includes a wafer slot 276 in a door plate 274, which is part of the door assembly. Depicted is a top view of bottom plate 244, a cross section A—A of the bottom plate 244, and a front view of door plate 274 including wafer slot 276. Looking at cross-section A—A the chamber door assembly 252 has a door cavity 280 which holds a door 278. A longitudinal slot in the bottom plate 244 provides access for introduction of the wafer into the chamber. The central horizontal plane of this slot corresponds with the center of the process cavity 246, so that the wafer can be placed at its final processing destination without additional manipulation inside the process cavity. A door mechanism (also called a slit-valve) is mounted to the outside of the bottom plate of the process chamber in such a way as to be aligned with slot 276. The door mechanism is an internally captured mechanism that permits internal pressure to reinforce its sealing. A more detailed description of this door mechanism is disclosed in U.S. patent application Ser. No. 10/007,227, which is herein incorporated by reference for all purposes. Door assembly 252 allows introduction and withdrawal of a wafer, without having to disengage the top and bottom plates of the process chamber. Also, by requiring movement of only small and light components, the mechanism provides faster exchange of wafers. This provides a high-throughput process environment for wafer cleaning.

Also as mentioned, supercritical cleaning solution enters the process cavity of process vessel 106, through inlets 250, and a flow field of the solution passes over at least a surface of the wafer. After passing over the wafer, the supercritical cleaning solution, including any contaminates that were removed from the wafer surface, pass into an outlet 254 of the process chamber. Preferably, the flow field of supercritical cleaning solution is a uniform flow front that passes over the surface or surfaces of the wafer to be cleaned. This flow field may impinge on the wafer surface at any number of angles or configurations.

Figure 23:
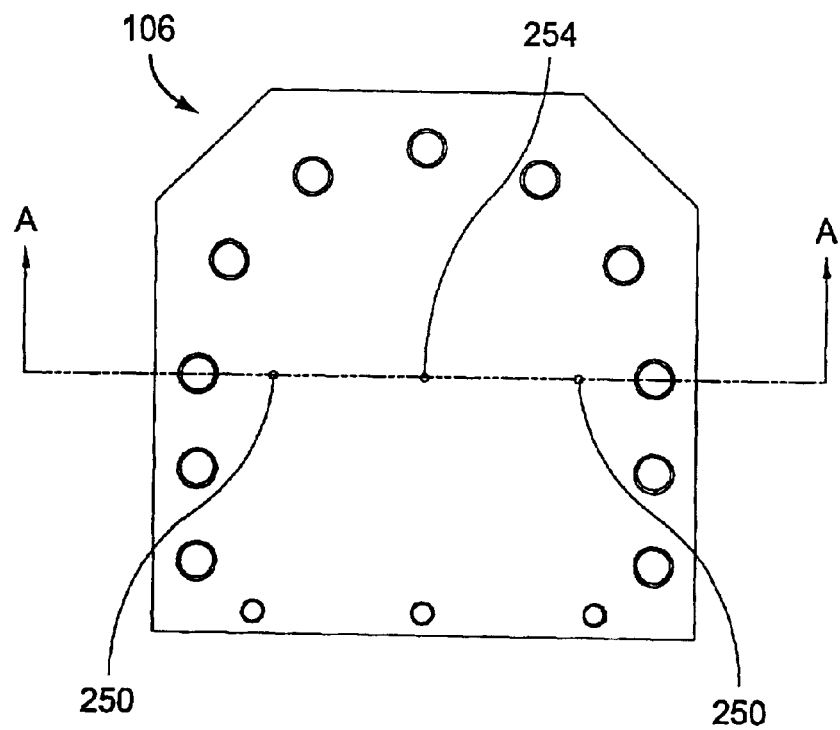
FIG. 23 depicts various views of a flow system in accordance with the invention.
Figure 23:
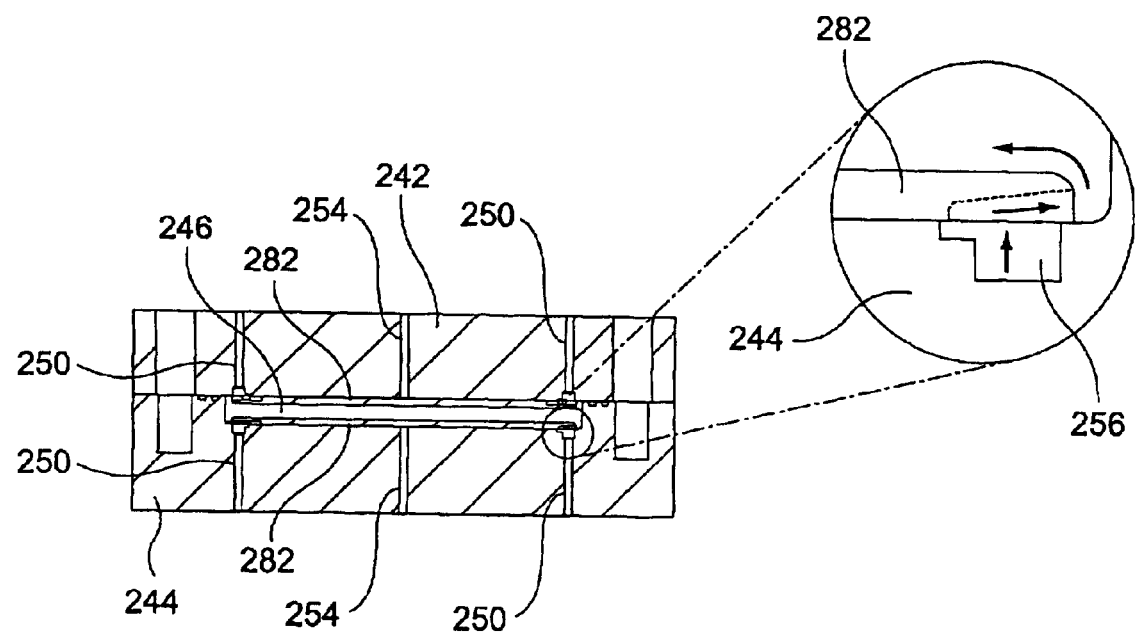

In a preferred embodiment, the flow field is created by flowing supercritical cleaning solution through a plurality of flow plenums. FIG. 23 shows a cross-sectional portion A—A of the process chamber 106. As seen in the detail of section A—A, bottom plate 244 has a flow plenum 256. Supercritical cleaning solution enters the process vessel 106 through inlet 250 and flows through plenums 256 (top plate 242 also has a plenum 256). Flow into each of the plenums 256 may be directed by one or more inlet ports 250. In the embodiment depicted in FIG. 23, two diametrically opposed inlets 250 are shown. One skilled in the art will understand that more than two such inlet ports may also be used without escaping the scope of the invention. Plenum 256 is mated with a flow distribution manifold 282. When mated, supercritical solution exiting plenum 256 traverses a plurality of openings in flow distribution manifold 282 in order to create the flow field for cleaning the wafer (arrows in the detail of FIG. 23 indicate flow out of plenum 256 and through an opening in manifold 282). Flow is distributed in the chamber through the gap between the wafer (not shown) and the chamber walls. In this example, two fluid distribution plenums 256 are machined (for example) into both the top and bottom plates. These plenums, in conjunction with corresponding flow distribution manifolds 282, distribute process fluid to the space above and below the wafer, respectively. By providing for flow above and below the wafer, cleaning and residue removal is affected on both sides. Also, distributing flow on both sides of the wafer prevents creation of large pressure differences across the front and back side wafer surfaces. Such large pressure differences can shatter fragile semiconductor wafers.

As mentioned, to uniformly distribute the process fluid flow, a flow distribution manifold is mated with each plenum. The distribution manifold has a plurality of openings (e.g. grooves or holes) that permit fluid to be transported from the plenum into the process cavity. Preferably there are between about 4 and 72 openings in the flow distribution manifolds. Process fluid flows inwards from the circumferential periphery of the wafer to its center. For example, as depicted by the arrows in the detail of FIG. 23, the flow of supercritical cleaning solution exiting the groove in manifold 282 is deflected off the wall of the process cavity, inward toward the wafer. Exit ports 254 at the center of the process cavity, in both the top and bottom plates, allow uniform exit of the fluid from the process chamber. Alternatively, process fluid can be flowed from the center of the process vessel to its circumferential periphery, in a reverse of the flow pattern described above. In this case the fluid impinges on the center of the wafer and flows radially outwards over the wafer surfaces.

Figure 24:
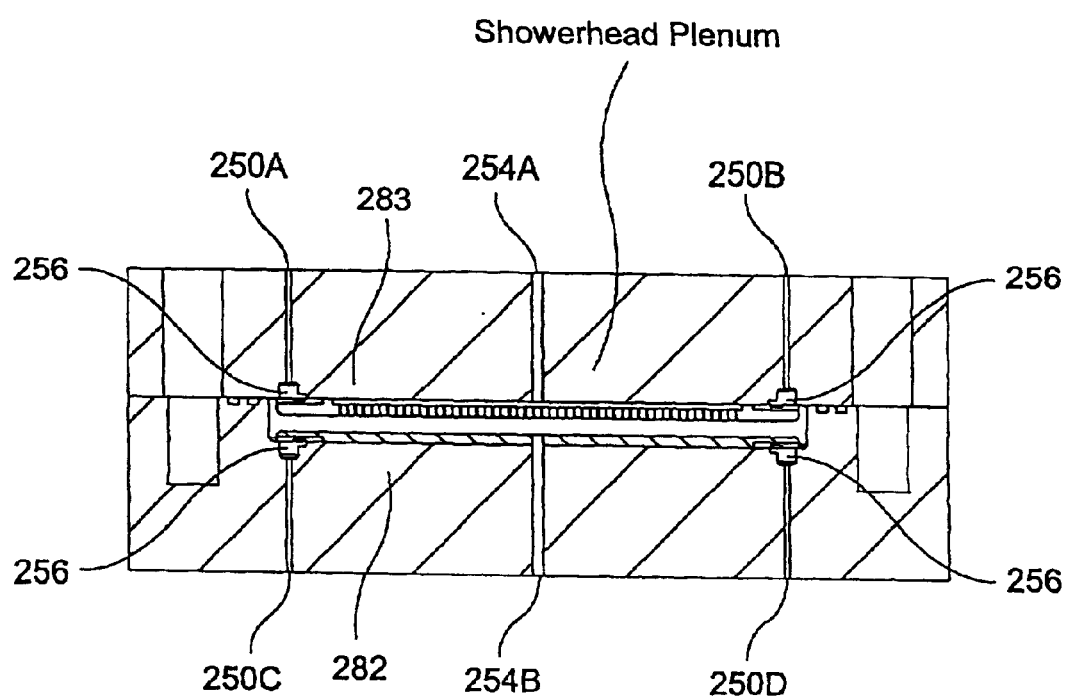
FIG. 24 depicts a cross-section of a showerhead in accordance with the invention.

In another embodiment, fluid is distributed at least on one surface of a wafer by use of a showerhead. Preferably the showerhead includes a plate with a pattern of holes therethrough that are arranged and sized to provide a uniform flow distribution over the wafer. FIG. 24 depicts a showerhead in accordance with the invention. Fluid, in this case, flows radially outwards towards the edge of the wafer. The flow is then directed inward under the wafer to exit from the bottom center of the chamber. The arrangement of plenums 256, inlet ports 250, and exit ports 254 can be used to provide for many different combinations of flow patterns. Additionally, multiple flow patterns are provided by changing flow distributors.

The arrangement of inlets, outlets, and flow distribution manifolds also permits differentiation between ports through which pressurization and depressurization occur and those that are used only for recirculation. For example, in one embodiment, inlet ports 250A, 250B, 250C, and 250D are used to provide pressurization and depressurization only. Top ports 254A, and bottom ports 254B are used for recirculation in conjunction with a showerhead as depicted in FIG. 24. In this configuration, pressurization of the process vessel does not induce mechanical forces on a substrate contained within the process vessel cavity because fluid is introduced on both sides of the substrate. After the process vessel has reached operating pressure, recirculation pump 138 is preferably used to circulate the supercritical cleaning solution via ports 254A and 254B. In this embodiment, recirculating cleaning solution, for example, enters the vessel from port 254A and flows through the showerhead 283 and over the wafer front side or work surface. The cleaning fluid then flows over the wafer backside and exits the process vessel via port 254B.

Flow distribution manifolds 282 serve not only to create the flow field of the supercritical cleaning solution, but also serve as a volume element in the process cavity of process chamber 106. Process cavity 246 is filled with supercritical cleaning solution during processing. Preferably the amount of supercritical solution needed to charge the process vessel is small. To reduce the quantity of solution needed for processing, and to decrease depressurization time, the process cavity volume can be reduced by design of flow distribution manifolds 282. As seen in the example of FIG. 23, although ring structures can be used for manifolds 282 (in order to mate with plenums 256), preferably disk shapes are used so that the bulk of material of flow distribution manifolds 282 occupies volume of the process cavity. The thickness of flow distribution manifolds 282 will increase or decrease the required volume of process fluid needed to fill the process cavity.

Additionally, the surface of the flow distribution manifolds that is exposed to the wafer may have dimensions or shapes which help to mediate the flow field across the wafer surface to be cleaned. Thus, not only are flow distribution manifolds 282 designed to create a flow field via the plurality of grooves or holes as described above, but also by virtue of their overall shape. For example, the flow distribution manifolds may have chevrons, fins, channels, convexities, concavities, or other flow-mediating contours on a surface that faces the wafer in the process cavity.

Figure 25:
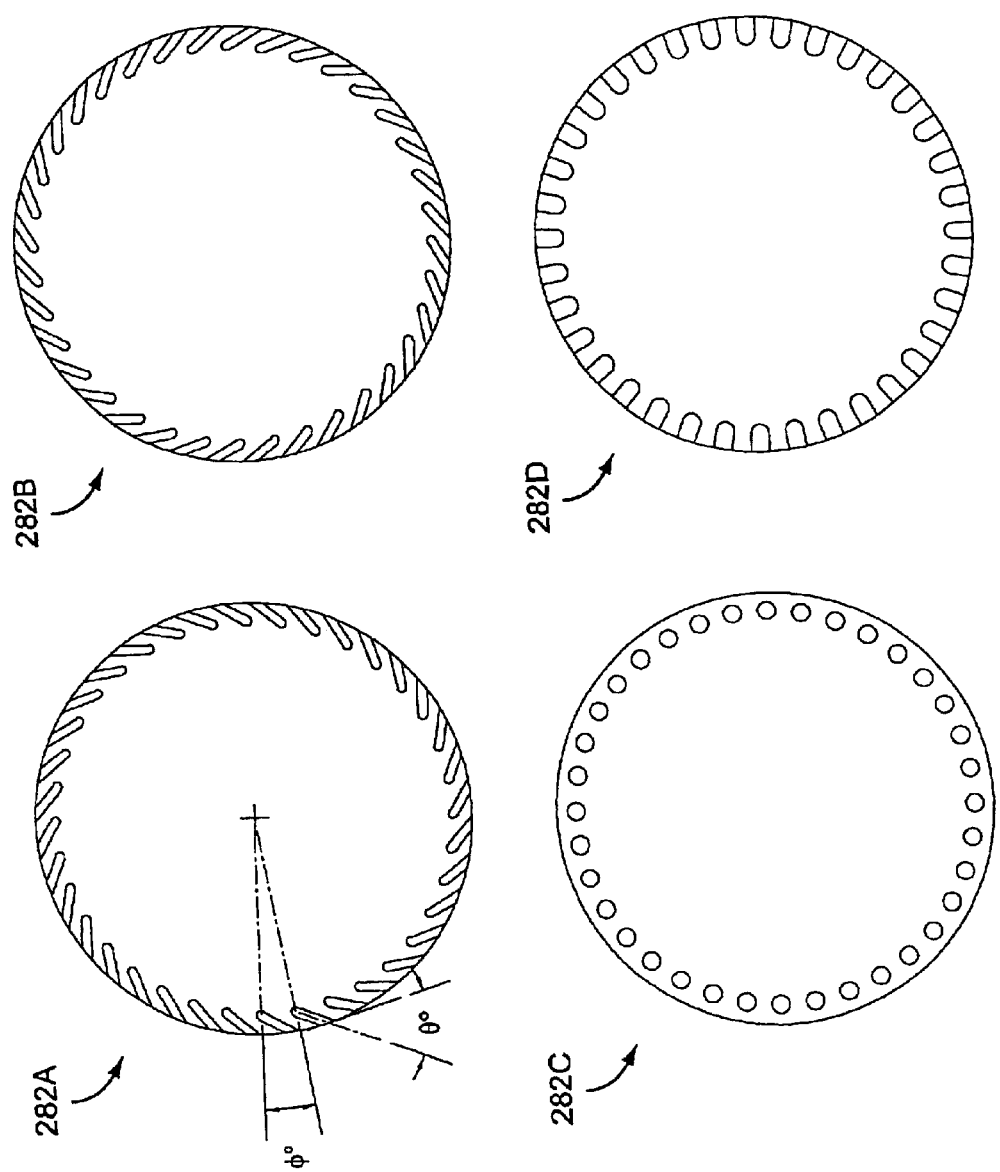
FIG. 25 depicts various flow distribution manifolds in accordance with the invention.

FIG. 25 shows a number of distribution manifolds 282A—D (disk shaped). In these examples, the face of flow distribution manifolds that is mated to the flow plenums is shown. Flow distribution manifold 282A has a plurality of angled grooves about its perimeter. Referring back to FIG. 23, these grooves direct fluid flow from plenum 256 toward an interior wall of the process cavity. The flow is then deflected toward the outer perimeter and over the surface of the wafer as indicated by the arrows in the detail of FIG. 23. Referring again to FIG. 25, the number of grooves or holes and the angle at which they are aligned will effect the hydrodynamic properties of the flow field. In this diagram, the angle $\phi$ describes the angular interval between grooves of flow distribution manifold 282A. Preferably the angular interval between grooves is between about 5 and 45 degrees. Also shown is the angle $\theta$. This describes the angle of tangency that is given to the grooves. Preferably the angle of tangency is between about 15 and 75 degrees. Flow distribution manifold 282B shows that the grooves can be not only counter clockwise but clockwise in orientation. The top and bottom flow distribution manifolds in this example may be complementary in their groove structure. Flow distribution 282C shows an example of a plurality of holes. Flow distribution manifold 282D has grooves that radiate out from its center, that is, their angle of tangency is 90°. Flow distribution manifolds are preferably made of the same corrosion resistant materials as the process vessel of the invention.

Figure 26:
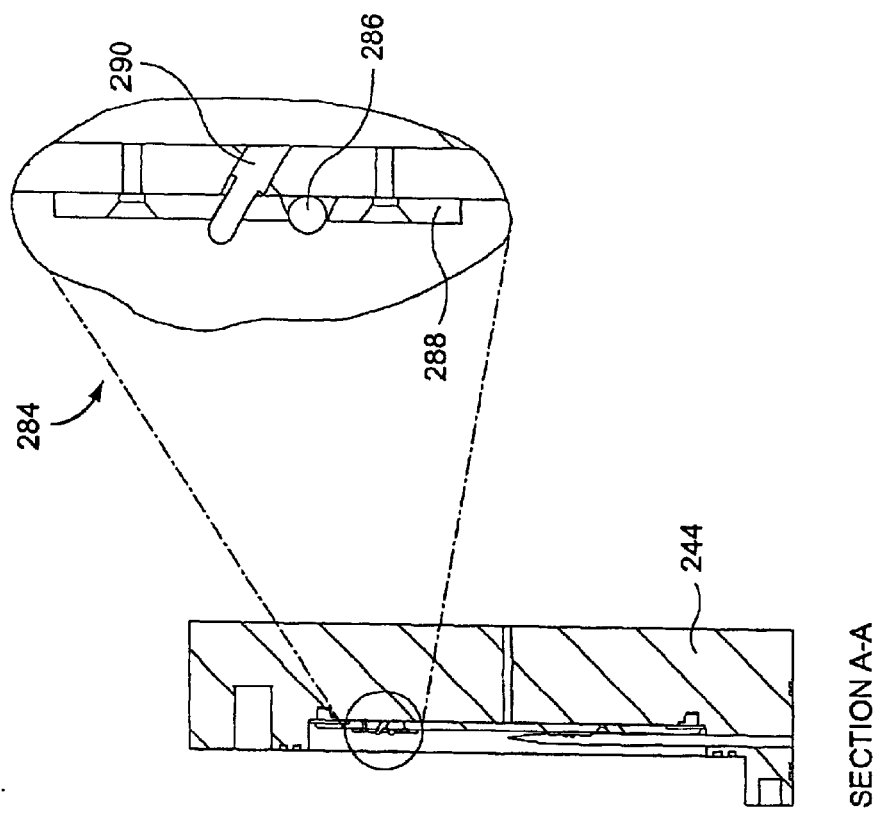
FIG. 26 depicts various views of a wafer support in accordance with the invention.
Figure 26:
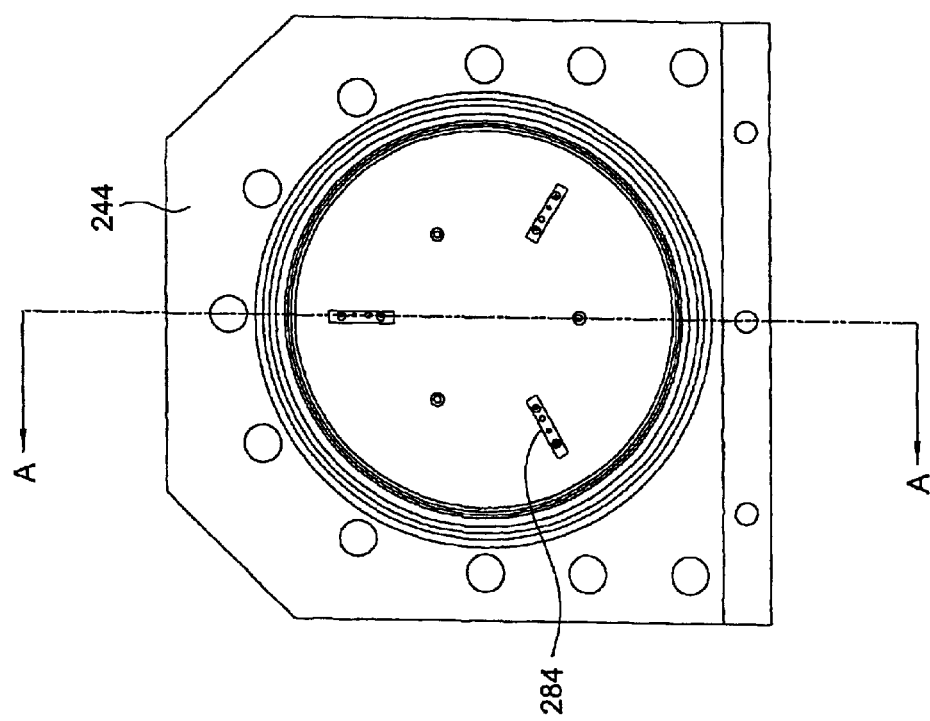

As mentioned above, apparatus of the invention include a process vessel which has a wafer support. FIG. 26 shows one example of a wafer support in accordance with the invention. Bottom plate 244 contains a series of substrate pin assemblies 284. As depicted, there are three such assemblies 284 on a wafer support area of bottom plate 244. As seen in the detail of cross-section A—A, substrate pin assembly 284 includes a point contact 286 and a wafer guide 290. In this case, the point contact is a spherical element held down by a retainer 288. Point contact 286 provides support to the wafer with a minimum of contact to the wafer surface. In this example, point contact 286 touches the wafer at three points. Wafer guides 290 keep the wafer oriented (preferably centered) in the wafer support area during processing. Preferably both point contact 286 and wafer guides 290 are made from inert materials such as ruby, quartz, sapphire, ceramic alumina, aluminum, titanium, and the like. In this example, wafer guides 290 are inclined at an angle of between about 60 and 85 degrees to the horizontal (plane of the wafer) and are arranged around the periphery of the substrate. By angling the wafer guides 290, a wafer introduced into the chamber that is out of alignment will be guided by the angled sides of the wafer guides into a central position over point contacts 286.

In some embodiments of the invention it may be desirable to rotate a wafer or a plurality of wafers during cleaning. In a cylindrical process cavity where for example process fluid flow is directed radially inward as described above, the velocity of process fluid flow increases near the center of the wafer. In mass transport limited processes, this may cause uneven residue removal and substrate cleaning. To counteract this effect, wafer rotation may be performed. Rotating a wafer around its central axis increases the effective fluid velocity at its periphery. This counteracts the inherently uneven fluid flow velocity distribution described above.

Figure 27:
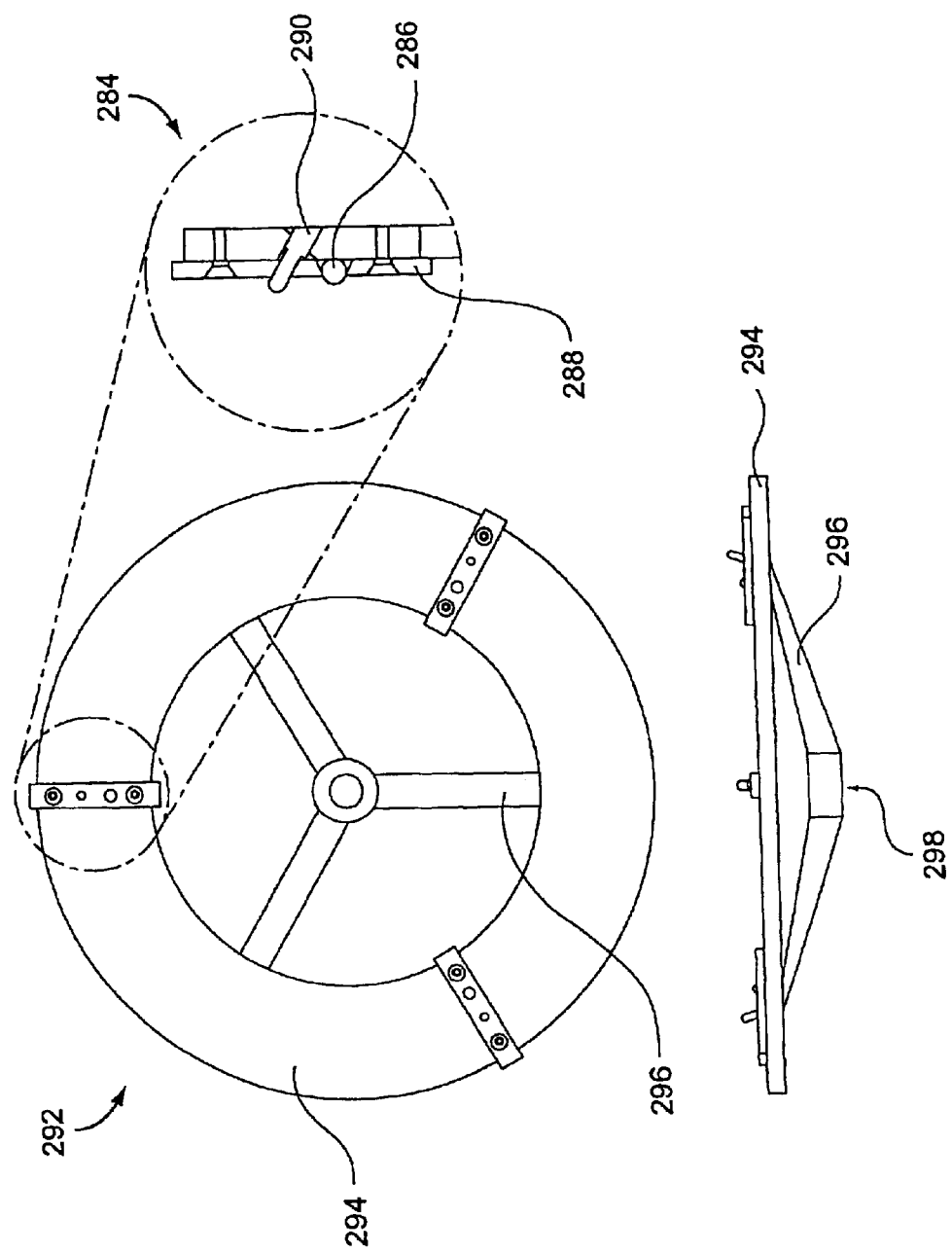
FIGS. 27-28 depict various views of a wafer rotation mechanism in accordance with the invention.

FIG. 27 shows an embodiment of the invention for rotating a wafer using a magnetically coupled drive. Rotating stage 292 has an open ring structure 294 that is supported by supports 296. The open ring structure of the support allows supercritical fluid to contact both the front and backside of the wafer thereon. Mounted on ring 294 is plurality of substrate support assemblies, 284, as described in relation to FIG. 26. The wafer is positioned on rotating stage 292, which is coupled to a magnetic drive via a coupling 298. Coupling 298 is attached to a shaft (see FIG. 28) that is driven by a magnetically coupled drive device. One skilled in the art would understand that an analogous wafer rotation device can be designed to hold a plurality of wafers.

When flow is directed inwards by the flow distribution manifolds as described above, the velocity of fluid is inversely proportional to the radial position at which the velocity is being computed. In direct contrast, a rotating wafer causes the velocity to be directly proportional to the value of the radius. These two phenomena cancel each other out. The result is more uniform relative velocity between fluid and wafer.

Figure 28:
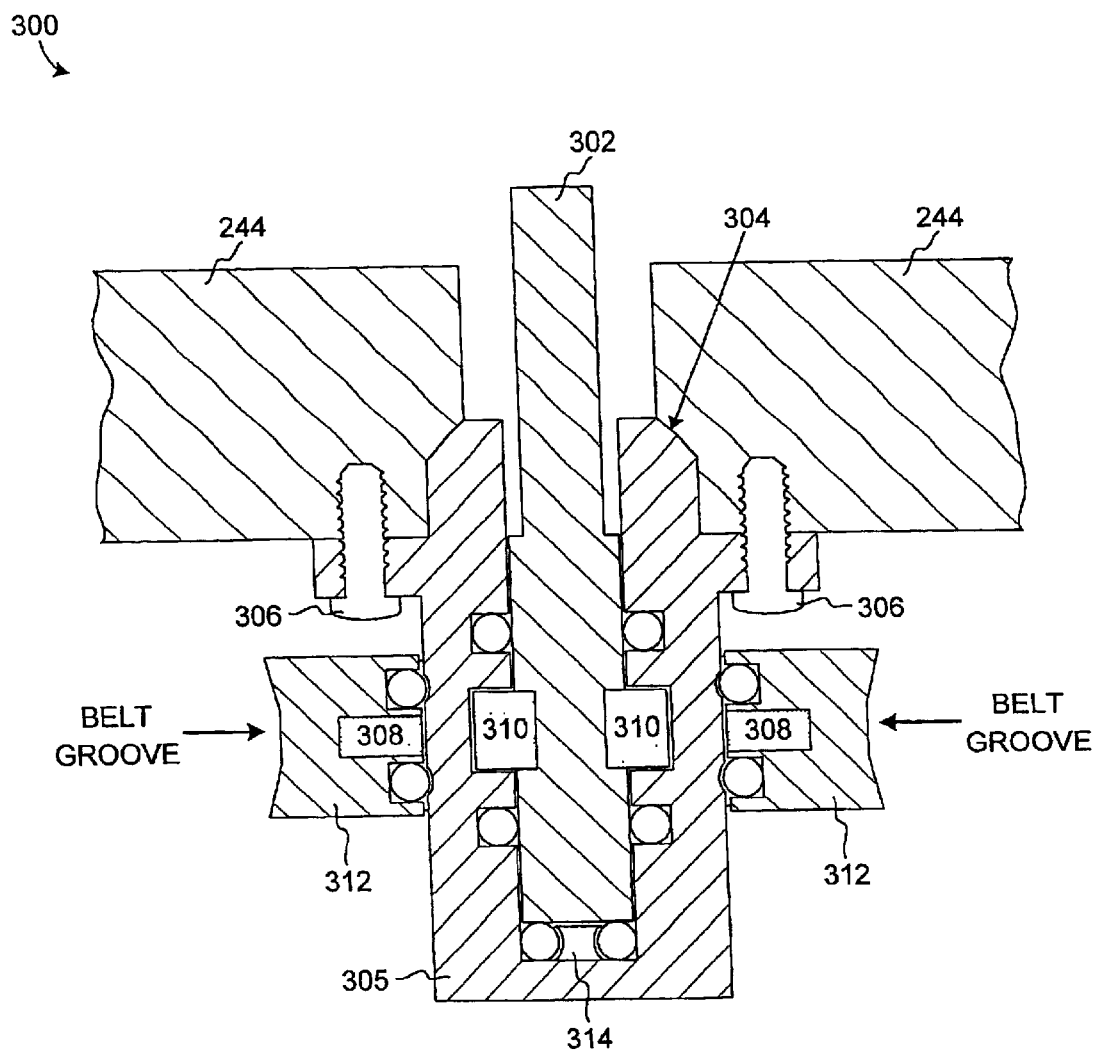

FIG. 28 shows an exemplary magnetically coupled drive apparatus of the invention. Magnetically coupled drive, 300, is used to transmit motion between a servomotor or stepper motor outside a pressurized enclosure, for example process vessel 106, to components within the enclosure. As mentioned, a shaft 302 is coupled to the rotating shaft coupling 198 (depicted in FIG. 27). A magnetically coupled drive head 305 is equipped with a high pressure fitting 304 which makes a metal-to-metal seal against one of the plates of the process vessel, in this case lower plate 244. This seal is fluid-tight, and withstand the pressure of a supercritical solution. In this example, bottom plate 244 is connected to drive head 305 via bolts 306. Alternatively drive head 305 can be directly threaded into lower plate 244. Motion from a motor is coupled to shaft 302 by means of permanent magnets 308 and 310. A belt-driven pulley 312 drives permanent magnets 308, rotating them about the exterior of drive head 305. As permanent magnets 308 rotate about drive head 305, they induce motion in shaft 302 via its embedded magnets 310. Pulley 312 and shaft 302 rotate about drive head 305 via a plurality of ball bearings. Thrust bearing 314 accommodates downward force from shaft 302. Thrust bearing 314 also contains ball or needle bearings for near frictionless movement.

Figure 29:
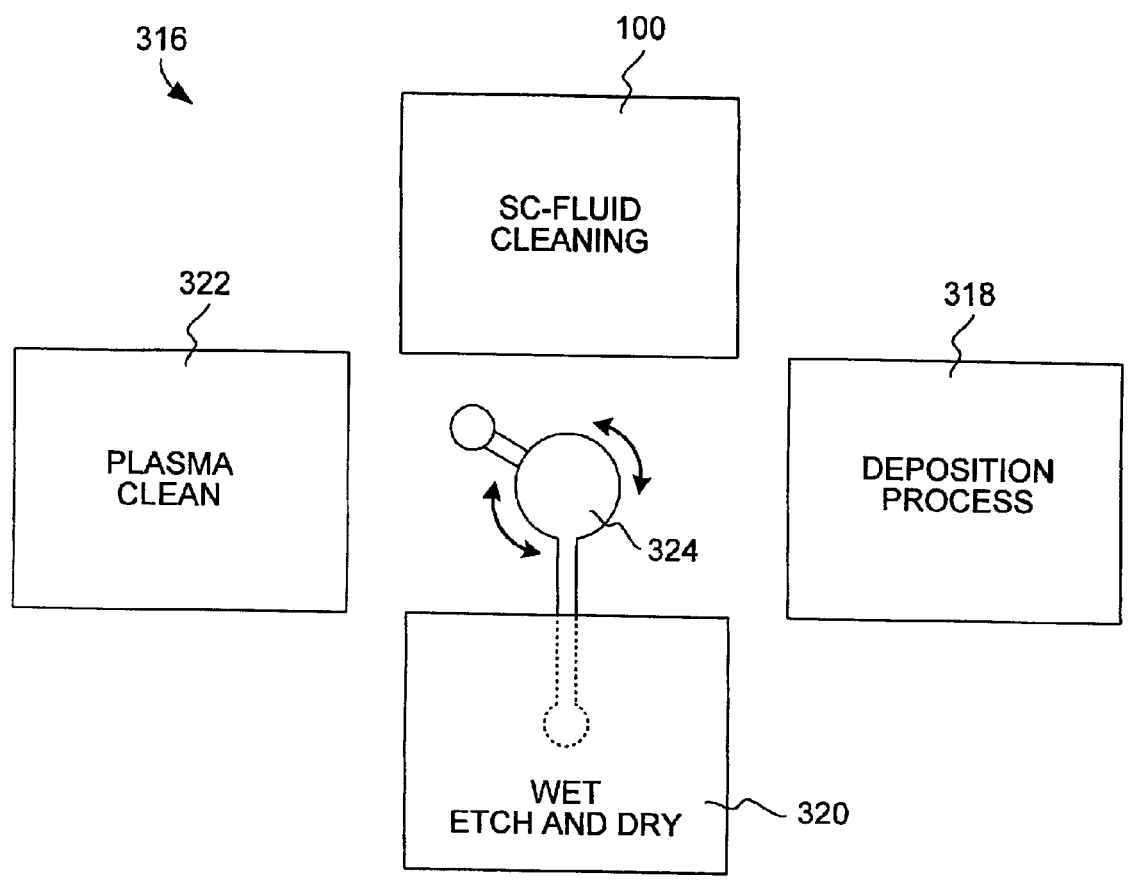
FIG. 29 is a simplified block diagram showing a multi-pressure wafer processing tool in accordance with the invention.

Aspects of the invention not only include systems such as described above in relation to FIGS. 1-28, but also tools that embody such apparatus in a modular format. FIG. 29 is a simple block diagram showing a multi-station wafer processing tool, 316, in which a modular apparatus of the invention can be used. For example, wafer processing tool 316 has four process stations. Each station is designed to treat the wafer surface in some manner, in many cases, either adding a layer or removing a layer of some type. The four stations in this schematic are: a supercritical fluid cleaning station 100 (as described above), a deposition module 318, a wet etch and dry module 320, and a plasma clean module 322. A robotic arm, 324, transfers wafers from one station to the next, as indicated by the dashed line representation and double-headed arrows. The arm's end effector can extend into each of the modules and retract in order to transfer wafers to and from each of the modules. No load lock is necessary because each of the modules is self-contained. Alternatively, a centralized load lock may be coupled to each module and provide inert atmosphere protection between processing cycles in each module.

Apparatus 316 is a multi-pressure tool. For example, a wafer may be brought into this tool after having had inter-layer connect features such as vias and trenches etched into a dielectric layer. The wafer is first subjected to a plasma strip under reduced vacuum to remove photoresist. It is then processed in the wet etch and dry module at atmospheric pressure for removal of post-etch residue. The wafer is then processed in the supercritical fluid cleaning module at elevated pressure for removal of those residues not accessed by wet cleans. Finally, the wafer is processed at ultra-high vacuum in the deposition chamber where a variety of thin films (e.g. dielectrics) can be deposited on the wafer. After this the wafer can go back to an etcher for further development of additional inter-layer connect features such as vias or trenches.

Figure 30:
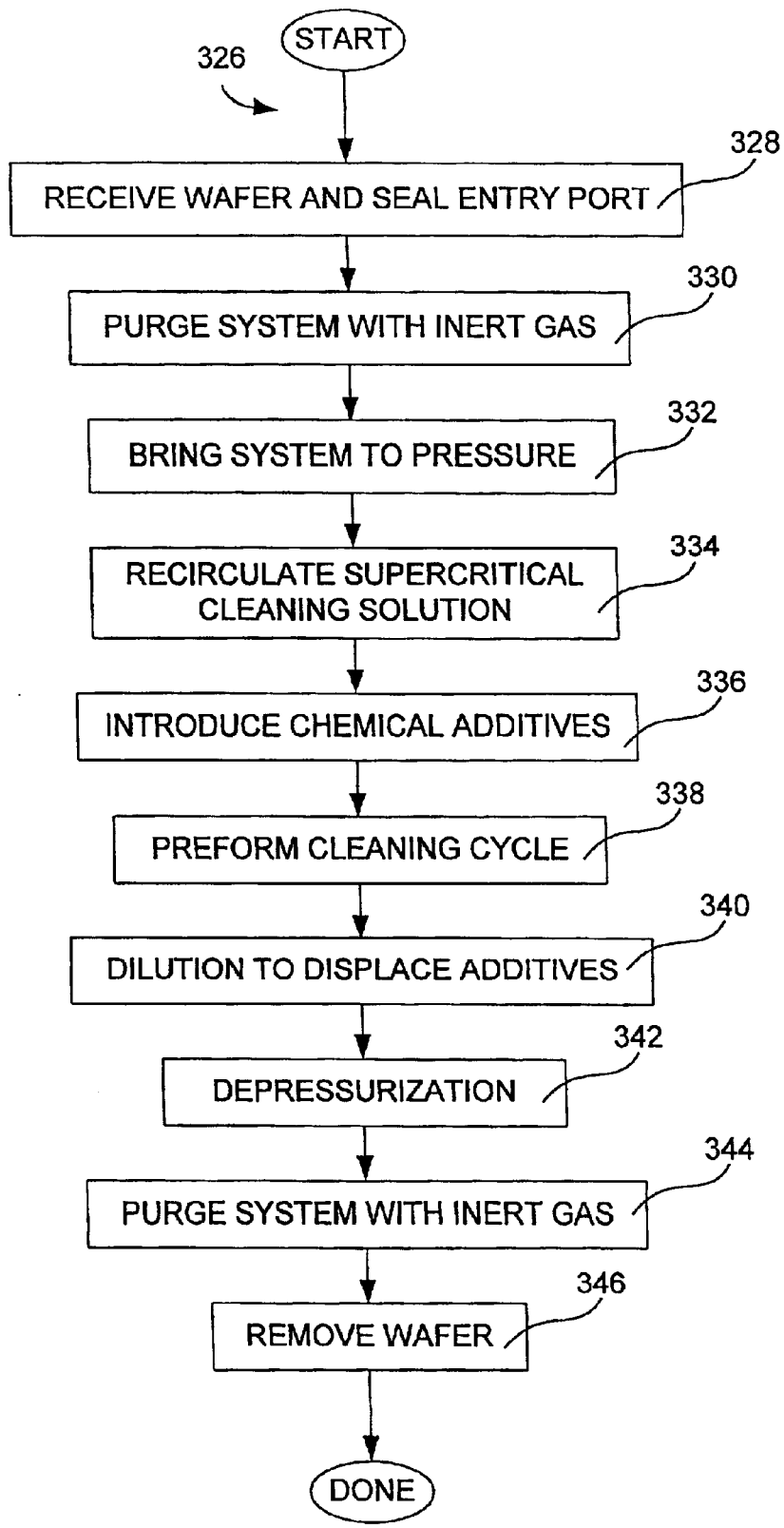
FIG. 30 is a flow chart showing aspects of a process flow in accordance with the invention.

As mentioned, another aspect of the invention is a method of cleaning a semiconductor wafer. FIG. 30 depicts aspects of a process flow, 326, in accordance with methods of the invention. Methods of the invention may include more or fewer steps than process flow 326. Apparatus of the invention as described, for example in relation to FIGS. 1-28 above, are particularly well-suited to carry out methods of the invention.

Beginning at block 328, a wafer is introduced into the process chamber. Next, the supercritical wafer cleaning system is purged with an inert gas. See 330. The system is brought to supercritical pressure using a desired solvent. See 332. As mentioned, this is preferably done using a linear ramping technique, as described above in relation to FIG. 12. A preferred solvent of the invention is carbon dioxide, although other solvents or solvent mixtures may be used.

Once the desired pressure (and density) of the supercritical solvent is reached, recirculation of the supercritical solvent through the system is commenced. See 334. As described above, recirculation includes presenting a flow field over the wafer. In a preferred embodiment, the flow field encounters both sides of the wafer equally. In this way, both sides of the wafer are cleaned, and forces acting on the wafer by the supercritical solvent are balanced. Recirculation may continue into the depressurization phase of the cleaning process, that is, sub-critical fluids may be circulated through the system as well as supercritical fluids.

Chemical additives are introduced into the supercritical solvent. See 336. As described above, additives are preferably introduced via the recirculation system to aid in mixing. However, the invention is not limited in this way. Also as mentioned, some venting may be performed simultaneously with chemical additive addition to mitigate pressure buildup due to the additional volume of the additive. Preferably, supercritical conditions are maintained throughout the chemical additive introduction. The chemical additive or additives dissolve in the supercritical solvent to produce a supercritical cleaning solution.

Figure 31:
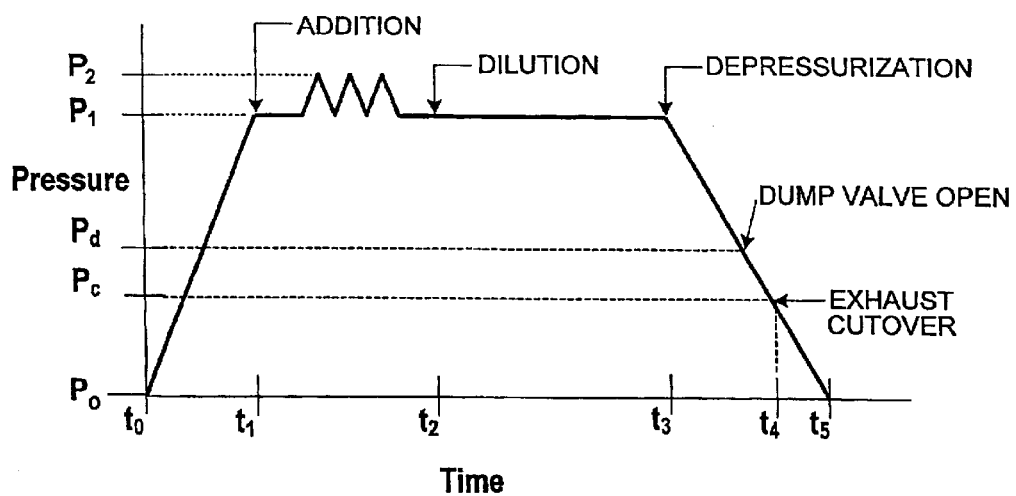
FIG. 31 is a graph showing pressure vs. time in accordance with wafer cleaning methods of the invention.

After the desired additive or additives are introduced into the system, the cleaning cycle with the resultant supercritical cleaning solution is performed. See 338. As described in relation to FIG. 12, in one preferred embodiment, this is done isobarically. In another preferred embodiment, the pressure of the supercritical cleaning solution is pulsed within the supercritical regime (preferably not to exceed about 5000 psi) to more effectively clean the wafer. Preferably, the pressure is pulsed between about 1 and 10 times during the cleaning cycle. FIG. 31 depicts such a pulsing sequence during the cleaning cycle. FIG. 31 is a graph of pressure vs. time for a cleaning cycle of the invention that uses a pulsed-pressure sequence. The graph is similar to that in FIG. 12. However in this case, after the desired supercritical pressure $P_1$ is reached and addition of chemical additives is complete, the pressure is pulsed to a higher value, $P_2$, three times before the dilution phase beginning at $t_2$. Preferably, the transition to a different pressure than the predominate supercritical pressure for the cycle (in this case $P_1$) is made with a linear ramp, as depicted. The three pressure pulses in this example were all to a greater pressure value, $P_2$, than pressure $P_1$. In other embodiments, the pressure pulse profile may include pressure drops. As mentioned, preferably supercritical pressures are maintained throughout a cleaning cycle ($t_1$ through $t_3$). Additives can be added at any time prior to dilution time $t_2$. Pulsing sequences of the invention are not necessarily in continuous succession as in FIG. 31, that is, there may be time delays between individual pressure pulses. In some cases it may be desirable to introduce a chemical additive during a pulsing sequence. In other cases, it is beneficial to provide pressure pulsing of the supercritical solution after additive addition. Pulsing helps loosen up particularly adherent material matrices on the wafer surface and thus aid in complete penetration therein of the chemical additives.

Referring again to FIG. 30, after the cleaning cycle is complete, dilution of the supercritical cleaning solution is performed. See 340. Referring to FIG. 31, commencement of dilution is preferably preceded by any pulse sequences.

Dilution cycle times may be longer or shorter than cycle times when substrates are exposed to additives in solution (at their highest concentration). Dilution is performed as described above in relation to FIGS. 11 and 12. Again, the primary goal is to dilute the supercritical cleaning solution to a point where any chemical additives in the solution will not fall out of solution once the system pressure falls below supercritical. Therefore the endpoint of the dilution under supercritical conditions need not include a complete removal of the additive. An endpoint where the concentration of the additive in the solvent is low enough that it will not precipitate or otherwise come out of the solvent's solution phase, when sub-critical pressures are reached, is acceptable. That is, dilution can continue into the depressurization phase of a cleaning method. For example, if additives with high solubility (even at sub-critical conditions) are used, then a dilution at supercritical conditions may not be necessary. Referring to FIG. 31, in such a case, the dilution may commence after depressurization starts at time $t_3$. In another example, if a particular photoresist material is removed during the cleaning cycle, and that material is sparingly soluble (even in the supercritical solvent), then a dilution cycle under supercritical conditions is preferable.

Referring again to FIG. 30, after dilution of the supercritical cleaning solution, the system is depressurized. See 342. This is preferably performed in the manner described above in relation to FIGS. 11 and 12. That is, after dilution, the solution is allowed to vent faster than during dilution (preferably a flow valve is opened to release the supercritical solvent or solution faster than the valve used for dilution). During depressurization, inlet valve 132 (see FIG. 3) is closed to prevent introduction of any additional solvent. In another embodiment, a pump (e.g. pump 114 in FIG. 2), used to directly pressurize the system, is stopped to prevent addition of solvent. As mentioned, preferably solvent from the venting supercritical solution or solvent is captured, purified, and recycled into the solvent delivery system for reuse.

After dilution and depressurization, the wafer is in contact only with pure solvent or solvents under sub-critical conditions. In many cases, the solvent will be a gas, for example carbon dioxide. At this point, the system is purged with an inert gas, such as helium, argon, or nitrogen. See 344. This is done to protect the cleaned wafer from any reactions between the wafer surface and atmospheric gases, moisture, solvents, and the like. After purging the system, the wafer is removed and the method is done. See 346. As mentioned, the wafer may be transported directly into a centralized load lock, to avoid any exposure to atmospheric conditions during processing. In a multi-pressure cluster tool, the wafer may then be delivered to the next processing module on the tool platform via the central load lock or to an inert-gas protected, gas-tight storage vessel.

Although various details have been omitted for clarity's sake, various design alternatives may be implemented. Therefore, the present examples are to be considered as illustrative and not restrictive, and the invention is not to be limited to the details given herein, but may be modified within the scope of the appended claims.

What is claimed is:

1. A system for cleaning semiconductor wafers, the system comprising:

a solvent delivery mechanism configured to provide a supercritical cleaning solution;

a process vessel in downstream fluid communication with the solvent delivery mechanism, said process vessel comprising a wafer support that includes:

a plurality of point contacts configured to support the wafer or plurality of wafers while making minimal contact with the wafer or plurality of wafers; and a plurality of wafer guides configured to position the wafer plurality of wafers in the wafer support, wherein each of the plurality of wafer guides is inclined at an angle of between about 60 and 85 degrees to the vertical (perpendicular to the wafer support surface) and is arranged around the periphery of the wafer or each of the plurality of wafers; and a recirculation system in fluid communication with the process vessel, said recirculation system comprising at least one flow distribution element configured to allow the supercritical cleaning solution to recirculate through the process vessel such that a flow field is established over at least one surface of a wafer or a plurality of wafers in the wafer support to thereby clean the surface or surfaces that contact the flow field.

2. The system of claim 1, wherein the solvent delivery mechanism comprises:

a source of a sub-critical cleaning solvent or a sub-critical cleaning solution in a liquid state;

an inlet configured to receive the sub-critical cleaning solvent or the sub-critical cleaning solution and deliver it to a supercritical solution generator configured to convert the sub-critical cleaning solvent or the sub-critical cleaning solution into the supercritical cleaning solution; and an outlet configured to deliver the supercritical cleaning solution from the supercritical solution generator to the process vessel.

3. The system of claim 2, further comprising an additive delivery mechanism, said additive delivery mechanism configured to provide a chemical additive to at least one of the sub-critical cleaning solvent, the sub-critical cleaning solution, or the supercritical cleaning solution.

4. The system of claim 2, wherein the supercritical solution generator comprises:

a pump configured to pressurize the sub-critical cleaning solvent or the sub-critical cleaning solution to at least its critical point; and a heat exchanger in fluid communication with the pump, said heat exchanger configured to heat the sub-critical cleaning solvent or the sub-critical cleaning solution to at least its critical temperature.

5. The system of claim 4, further comprising:

a pressure sensor configured to measure the pressure in the process vessel; and a pressure controller configured to control the pressure in the process vessel in response to pressure information from the pressure sensor;

wherein control is achieved by adjustment of at least one of the pump and the heat exchanger.

6. The system of claim 4, wherein the solvent delivery mechanism further comprises a buffer vessel in downstream fluid communication with the heat exchanger, said buffer vessel capable of storing between about 5 and 25 times the volume of the supercritical cleaning solution than the volume of the process vessel.

7. The system of claim 6, further comprising:

a first pressure sensor configured to measure the pressure in the process vessel;

a flow control valve in downstream fluid communication with buffer vessel; and a first pressure controller configured to control the pressure in the process vessel in response to pressure information from the first pressure sensor;

wherein control is achieved by adjustment of the flow control valve.

8. The system of claim 7, further comprising:

a second press sensor configured to measure the pressure in the buffer vessel; and a second pressure controller configured to control the press in the buffer vessel in response to pressure information from the second pressure sensor;

wherein control is achieved by adjustment of at least one of the pump and the heat exchanger.

9. The system of claim 3, wherein the recirculation system comprises the additive delivery mechanism, said additive delivery mechanism configured to provide the chemical additive to the supercritical cleaning solution.

10. The system of claim 1, wherein the recirculation system comprises:

a pump configured to move the supercritical cleaning solution through the recirculation system;

an inline static mixer configured to provide a circuitous path to the supercritical cleaning solution.

11. The system of claim 10, wherein the recirculation system further comprises:

a first particulate filter in upstream fluid communication with the pump, said first particulate filter configured to remove particulates from the supercritical cleaning solution before said supercritical cleaning solution enters the pump; and a second particulate filter in upstream fluid communication with the process vessel, said filter configured to remove particulates from the supercritical cleaning solution before said supercritical cleaning solution enters the process vessel.

12. The system of claim 11, wherein the recirculation further comprises a differential pressure transducer configured to measure the pressure in the recirculation system at a point upstream from the first particulate filter and at a point downstream from the second particulate filter.

13. The system of claim 12, wherein pressure information from the differential pressure transducer is used to control flow of the supercritical cleaning solution through the recirculation system.

14. The system of claim 1, wherein the recirculation system comprises isolation valves for stopping fluid communication of the recirculation system with the process vessel.

15. The system of claim 1, further comprising a depressurization system configured to vent the supercritical cleaning solution from the system.

16. The system of claim 15, wherein the depressurization system is configured to vent the supercritical cleaning solution from the process vessel.

17. The system of claim 15, wherein the depressurization system comprises a plurality of control valves in parallel fluid communication, said plurality of control valves comprising:

a first exhaust flow control valve configured to meter the release of the supercritical cleaning solution no faster than said supercritical cleaning solution can be introduced into the process vessel by the solvent delivery mechanism;

a second exhaust control valve having a higher flow coefficient than the first exhaust control valve; and a dump valve having a higher flow coefficient than the second exhaust control valve.

18. The system of claim 15, further comprising a solvent recycle system in downstream fluid communication with the depressurization system, said solvent recycle system configured to capture vapor resulting from release of the supercritical cleaning solution by the depressurization system.

19. The system of claim 18, wherein the solvent recycle system is further configured to purify sub-critical media after capture to produce a recycled solvent.

20. The system of claim 19, wherein the solvent recycle system is further configured to deliver the recycled solvent to the solvent delivery mechanism for use in production of the supercritical cleaning solution.

21. The system of claim 19, wherein the solvent recycle system further comprises at least one of a filter, a distillation device, a liquid-gas separation device or a semi-permeable membrane to purify the sub-critical media.

22. The system of claim 1, wherein the process vessel comprises a first and a second plate, which when mated create a process cavity that encloses the wafer support.

23. The system of claim 22, wherein the process vessel comprises a corrosion resistant material.

24. The system of claim 23, wherein the corrosion resistant material comprises at least one of stainless steel, aluminum, titanium, hastelloy, and a nickel-iron alloy.

25. The system of claim 22, wherein the process cavity has a plurality of plenums configured to receive the supercritical cleaning solution from a process vessel inlet.

26. The system of claim 22, wherein the process vessel further comprises:

a slot configure to allow insertion of the wafer or the plurality of wafers into the process vessel; and a door mechanism configured to seal the slot while the process vessel is charged with the supercritical solution.

27. The system of claim 26, wherein the door mechanism comprises a sealing mechanism configured to allow internal pressure in the process vessel to reinforce its sealing ability.

28. The system of claim 22, further comprising:

a primary seal configured to form a fluid-tight seal between the first and second plates when mated; and a secondary seal configured to form a fluid-tight seal between the first and second plates when mated.

29. The system of claim 28, wherein the primary seal is a pressure-energized bore seal.

30. The system claim 28, wherein the primary seal is a spring-energized U-cup seal.

31. The system claim 28, wherein the secondary seal comprises two or more distinct sealing members.

32. The system of claim 28, wherein the secondary seal comprises at least one of a metal gasket, an elastomeric O-ring, a spring-energized U-cup, a T-seal, and a back-up seal.

33. The system of claim 28, wherein the primary and secondary seals comprise at least one of VITON™, EPDM, silicone, KALREZ™, CHEMREZ™, polyurethane, fluoropolymer, aluminum, brass, copper, stainless steel, and nickel.

34. The system of claim 32, wherein the back-up seal comprises at least one of fiberglass-reinforced plastic, polyvinyl chloride, and Delrin.

35. The system of claim 25, further comprising a plurality of flow distribution manifolds each dimensioned to mate with one of the plurality of plenums, when mated, said plurality of plenums and flow distribution manifolds are configured to create the flow field.

36. The system of claim 35, wherein each of the plurality of flow distribution manifolds comprises a plurality of holes configured to direct flow of the supercritical cleaning solution from its corresponding plenum to the process cavity.

37. The system of claim 35, wherein each of the plurality of flow distribution manifolds comprises a plurality of grooves configured to direct the flow of the supercritical cleaning solution from its corresponding plenum and onto an interior surface of the process cavity before flowing onto said at least one surface of the wafer or plurality of wafer.

38. The system of claim 37, wherein each of the plurality of grooves comprises between about 8 and 72 grooves.

39. The system of claim 38, wherein the angular in between grooves is between about 5 and 45 degrees.

40. The system of claim 39, wherein the angle of tangency is between about 15 and 75 degrees.

41. The system of claim 35, wherein the plurality of flow distribution manifolds comprise at least one of stainless steel, hastalloy, aluminum, titanium, and nickel-iron alloys.

42. The system of claim 1, wherein the plurality of point contacts and wafer guides comprises at least one of quartz, ruby, sapphire, ceramic alumina, aluminum, and titanium.

43. The system of claim 1, wherein the wafer support comprises a wafer rotation mechanism, the wafer rotation mechanism configured to allow rotation of the wafer or plurality of wafers during processing.

44. The system of claim 43, wherein the wafer rotation mechanism comprises a magnetically coupled drive.

45. The system of claim 1, wherein the recirculation system is configured such that the flow field produces approximately equal fluid pressure and flow dynamics on both sides of the wafer or plurality of wafers.

46. The system of claim 1, wherein the process vessel comprises a heater configured to heat one or more walls of the process vessel.

47. The system of claim 1, wherein the recirculation system comprises a heater configured to maintain the temperature of the supercritical cleaning solution as it traverses the recirculation system.

48. The system of claim 3, wherein the process vessel comprises the additive delivery mechanism, said additive delivery mechanism configured to provide the chemical additive to the supercritical cleaning solution.

49. The system of claim 3, wherein the solvent delivery mechanism comprises the additive delivery mechanism, said additive delivery mechanism configured to provide the chemical additive to the supercritical cleaning solution.

50. The system of claim 3, wherein the recirculation system comprises the additive delivery mechanism, said additive delivery mechanism configured to provide the chemical additive to a solvent to produce the sub-critical cleaning solution.

51. The system of claim 3, wherein the additive delivery mechanism comprises a syringe pump configured to deliver a liquid to the supercritical cleaning solution without the supercritical cleaning solution losing its supercritical state.

52. The system of claim 6, wherein the buffer vessel comprises a heater configured to maintain the temperature of the supercritical cleaning solution in the buffer vessel.

53. The system of claim 1, further comprising a pulsing mechanism coupled to at least one of the recirculation system and the process vessel, said pulsing mechanism comprises to control the pressure of the supercritical cleaning solution to which the wafer or plurality of wafers are exposed in manner that provides a pulsed pressure distribution.

54. The system of claim 35, wherein the of plurality of flow distribution manifolds further comprises a plurality of contoured surfaces configured to mediate the flow field.

55. The system of claim 54, wherein the plurality of contoured surfaces comprises at least one of fins, chevrons, baffles, convexities, and concavities.

56. The system of claim 11, wherein the first and second particulate filters are self-cleaning filters.

57. The system of claim 35, wherein at least one of the plurality of flow distribution manifolds is a showerhead.

58. A system for cleaning semiconductor wafers, the system comprising:
  a solvent delivery mechanism configured to provide a supercritical cleaning solution, wherein the solvent delivery mechanism comprises:
    a source of a sub-critical cleaning solvent or a sub-critical cleaning solution in a liquid state;
    an inlet configured to receive the sub-critical cleaning solvent or the sub-critical cleaning solution and deliver it to a supercritical solution generator configured to convert the sub-critical cleaning solvent or the sub-critical cleaning solution into the supercritical cleaning solution, wherein the supercritical solution generator comprises:
      a pump configured to pressurize the sub-critical cleaning solvent or the sub-critical cleaning solution to at least its critical point; and
      a heat exchanger in fluid communication with the pump, said heat exchanger configured to heat the sub-critical cleaning solvent or the sub-critical cleaning solution to at least its critical temperature;
    an outlet configured to deliver the supercritical cleaning solution from the supercritical solution generator to a process vessel; and
    a buffer vessel in downstream fluid communication with the heat exchanger;
  the process vessel in downstream fluid communication with the solvent delivery mechanism, said process vessel comprising a wafer support; and
  a recirculation fluid communication with the process vessel, said recirculation system comprising at least one flow distribution element configured to allow the supercritical cleaning solution to recirculate through the process vessel such that a flow field is established over at least one surface of a wafer or a plurality of wafers in the wafer support to thereby clean the surface or surfaces that contact the flow field;
  wherein the buffer vessel is capable of storing between about 5 and 25 times the volume of supercritical solution that the process vessel can store.

59. A system for cleaning semiconductor wafers, the system comprising:
  a solvent delivery mechanism configured to provide a supercritical cleaning solution;
  a process vessel in downstream fluid communication with the solvent delivery mechanism, said process vessel comprising a wafer support; and
  a recirculation system fluid communication with the process vessel, said recirculation system comprising:
    at least one flow distribution element configured to allow the supercritical cleaning solution to recirculate through the process vessel such that a flow field is established over at least one surface of a wafer or a plurality of wafers in the wafer support to thereby clean the surface or surfaces that contact the flow field;
    a pump configured to move the supercritical cleaning solution through the recirculation system;

an inline static mixer configured to provide a circuitous path to the supercritical cleaning solution
a first particulate filter in upstream fluid communication with the pump, said first particulate filter configured to remove particulates from the supercritical cleaning solution before said supercritical cleaning solution enters the pump;
a second particulate filter in upstream fluid communication with the process vessel, said filter configured to remove particulates from the supercritical cleaning solution before said supercritical cleaning solution enters the process vessel; and
a differential pressure transducer configured to measure the pressure in the recirculation system at a point upstream from the first particulate filter and at a point downstream from the second particulate filter.

* * * * *